US011393518B1

(12) United States Patent
Ocker

(10) Patent No.: US 11,393,518 B1
(45) Date of Patent: Jul. 19, 2022

(54) MEMORY CELL ARRANGEMENT AND METHODS THEREOF

(71) Applicant: Ferroelectric Memory GmbH, Dresden (DE)

(72) Inventor: Johannes Ocker, Dresden (DE)

(73) Assignee: FERROELECTRIC MEMORY GMBH, Dresden (DE)

( * ) Notice: Subject to any disclaimer, the term of this patent is extended or adjusted under 35 U.S.C. 154(b) by 0 days.

(21) Appl. No.: 17/341,884

(22) Filed: Jun. 8, 2021

(51) Int. Cl.
 *G11C 11/22* (2006.01)
(52) U.S. Cl.
 CPC ........ *G11C 11/2275* (2013.01); *G11C 11/221* (2013.01); *G11C 11/223* (2013.01)
(58) Field of Classification Search
 CPC .............................. G11C 11/22; G11C 11/2275
 USPC ......................................................... 365/145
 See application file for complete search history.

(56) References Cited

U.S. PATENT DOCUMENTS

| 6,760,246 B1 * | 7/2004 | Kamp ...................... G11C 11/22 365/65 |
| 2017/0162250 A1 * | 6/2017 | Slesazeck ............. G11C 11/223 |
| 2018/0366477 A1 * | 12/2018 | Liu ........................ G11C 11/221 |

OTHER PUBLICATIONS

Ocker, U.S. Appl. No. 17/341,880, filed Apr. 4, 2022, Notice of Allowance and Fees Due, dated Apr. 4, 2022.

\* cited by examiner

*Primary Examiner* — Muna A Techane
(74) *Attorney, Agent, or Firm* — Hickman Becker Bingham Ledesma LLP; Malgorzata A. Kulczycka

(57) ABSTRACT

Various aspects relate to a memory cell arrangement including: a plurality of spontaneous-polarizable memory cells; and a control circuit configured to cause a writing of one or more first memory cells by a writing operation, wherein the writing operation includes: supplying a write signal set to the plurality of spontaneous-polarizable memory cells to provide a write voltage drop at each of the one or more first memory cells to switch a respective polarization state, the write signal set causing a disturb voltage drop at one or more second memory cells that are not intended to be written, wherein the disturb voltage drop causes a disturb of the one or more second memory cells and maintains a respective polarization state; and wherein the control circuit is further configured to supply a counter-disturb signal set to the plurality of spontaneous-polarizable memory cells, wherein the counter-disturb signal set provides a counter-disturb voltage drop at the one or more second memory cells to at least partially compensate the disturb caused by the write signal set.

20 Claims, 11 Drawing Sheets

MEMORY CELL ARRANGEMENT AND METHODS THEREOF

TECHNICAL FIELD

Various aspects relate to a memory cell arrangement and methods thereof, e.g., a method of operating a memory cell arrangement.

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). The information stored in the memory cell may be obtained by determining in which of the possible memory states the memory cell is residing in. At present, various types of memory cells may be used to store data. By way of example, a type of memory cell may include a thin film of spontaneous-polarizable material, whose polarization state may be changed in a controlled fashion to store data in the memory cell, e.g. in a non-volatile manner. The memory cells may be integrated, for example, on a wafer or a chip together with one or more logic circuits.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1:
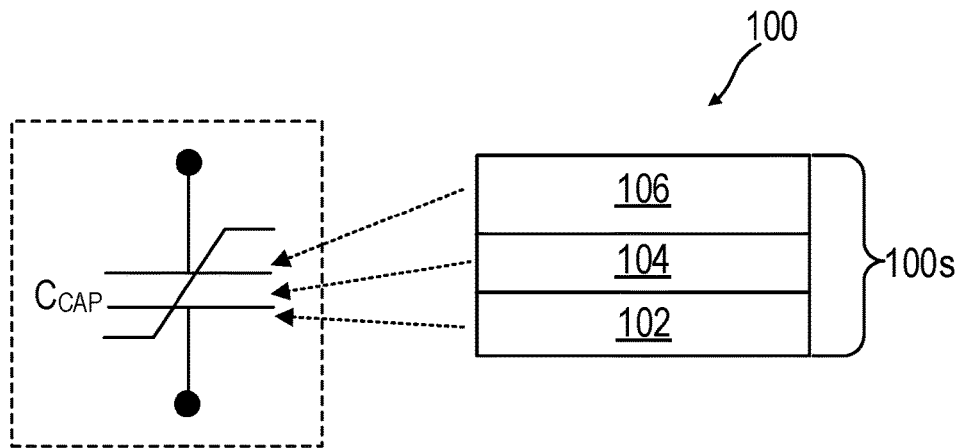
FIG. 1 shows schematically a capacitive memory structure, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a memory cell arrangement, a memory cell, or a control circuit). However, it may be understood that aspects described in connection with methods may similarly apply to the devices, and vice versa.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. In some aspects, a non-volatile memory technology may be based on at least one field-effect transistor (FET) structure. In some aspects, a memory cell may include a field-effect transistor structure and a capacitive memory structure (also referred to herein as memory capacitor) coupled to the field-effect transistor structure. The amount of charge stored in the capacitive memory structure may influence the threshold voltage(s) of the field-effect transistor structure. The threshold voltage(s) of the field-effect transistor structure may define the memory state the memory cell is residing in. In some aspects, the capacitive memory structure may be a ferroelectric capacitor structure (FeCAP) coupled to a gate electrode of the field-effect transistor structure to provide a ferroelectric field-effect transistor (FeFET) structure. Since a ferroelectric material (or, more in general, a spontaneous-polarizable material) may have at least two stable polarization states, it may be used to shift a threshold voltage of a field-effect transistor in a non-volatile fashion; therefore, it may be used to turn the field-effect transistor into a non-volatile field-effect transistor based memory structure. In other aspects, a non-volatile memory technology may be based on at least one capacitive memory structure. The capacitive memory structure may be or may include a ferroelectric capacitor structure. A ferroelectric material may turn a ferroelectric capacitor structure into a non-volatile capacitor-based memory structure, e.g. by controlling the amount of charge stored in the capacitor structure. The amount of charge stored in the capacitive memory structure may be read out by suitable electronic readout circuits, e.g., by a charge to voltage converter, by a determination of a switching current of the capacitive memory structure.

The terms "spontaneously polarized", "spontaneous-polarizable", or "spontaneous polarization" may be used herein with reference to the polarization capability of a material beyond dielectric polarization. The coercivity of a material may be a measure of the strength of the reverse polarizing electric field that may be required to remove a remanent polarization if present.

According to various aspects, a memory cell, a layer, as examples, may include or may be made of a polarizable material, e.g., a spontaneously polarizable material (such as an anti-ferroelectric and/or ferroelectric material, as example). An anti-ferroelectric material may show a hysteresis in the (voltage dependent) polarization, however, with no remanent polarization remaining in the case that no voltage drops over the anti-ferroelectric material. A ferroelectric material may show a hysteresis in the (voltage dependent) polarization, however, with a remanent polarization remaining in the case that no voltage drops over the ferroelectric material. A spontaneous polarization (e.g., a remanent or non-remanent spontaneous polarization) may be evaluated via analyzing one or more hysteresis measurements (e.g., hysteresis curves), e.g., in a plot of polarization, P, versus electric field, E, in which the material is polarized into opposite directions. The polarization capability of a material (dielectric polarization, spontaneous polarization, and a remanence characteristic of the polarization) may be analyzed using capacity spectroscopy, e.g., via a static (C-V) and/or time-resolved measurement or by polarization-voltage (P-V) or positive-up-negative-down (PUND) measurements.

The term "spontaneously polarizable material" or "spontaneous-polarizable material" may be used herein with reference to a material that has a polarization capability in addition to its dielectric polarization capability. A spontaneous-polarizable material may be or may include a spontaneous-polarizable material that shows a remanence, e.g., a ferroelectric material, and/or a spontaneous-polarizable material that shows no remanence, e.g., an anti-ferroelectric material.

The term "remanently polarizable" or "remanent-polarizable" with reference to a layer, a portion, a structure, a memory cell, as examples, may be understood as a layer that exhibits a remanent-polarization capability (e.g., in addition to a dielectric polarization capability and/or a non-remanent-polarization capability). A remanent-polarizable layer, a remanent-polarizable structure, a remanent-polarizable memory cell, a remanent-polarizable portion (only as examples) may include, in some aspects, a material that is remanently polarizable (i.e., that shows a remanence of the spontaneous polarization), e.g., a ferroelectric material. In other aspects, a remanent-polarizable layer, a remanent-polarizable structure, a remanent-polarizable memory cell, a remanent-polarizable portion (only as examples) may include a material that is spontaneous-polarizable and that shows no remanence, e.g., an anti-ferroelectric material under the additional conditions, that measures are implemented to generate an internal electric-field within the anti-ferroelectric material. An internal electric-field within an anti-ferroelectric material may be caused (e.g., applied, generated, maintained, as examples) in various ways, e.g., by implementing floating nodes that may be charged to voltages different from zero volts, e.g., by implementing charge storage layers, e.g., by using doped layers, e.g., by using electrode layers that adapt electronic work-functions to generate an internal electric field, only as examples.

In general, a remanent polarization (also referred to as retentivity or remanence) may be present in a material layer in the case that the material layer may remain polarized upon reduction of an applied electric field (E) to zero, therefore, a certain value for the electrical polarization (P) of the material layer may be detected. Illustratively, a polarization remaining in a material when the electric field is reduced to zero may be referred to as remanent polarization (also referred to herein as residual polarization). The remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials.

In the following, various aspects of a memory cell and/or a capacitive memory structure are described with reference to exemplary types of memory cells and/or capacitive memory structures. It is understood that, in general, a memory structure (e.g., a spontaneous-polarizable memory structure) as described herein may be a functional component that allows providing various types of memory cells, e.g., a capacitive memory cell as exemplarily illustrated in FIG. 1, e.g., a field-effect transistor based capacitive memory cell, as exemplarily illustrated in FIG. 2, or any other type of memory cell. According to various aspects, a memory structure may include one or more electrodes and at least one memory layer coupled to the one or more electrodes, the memory layer including a spontaneous-polarizable material. In some aspects, a memory structure may be or may include any type of capacitive memory structure ($C_{CAP}$). A capacitive memory structure itself may be understood as a memory cell, e.g., an array of capacitive memory structures may be addressed via control lines as a memory cell arrangement. In other aspects, a capacitive memory structure may be used in combination with a transistor, e.g., a FET having its gate coupled to an electrode of the capacitive memory structure, or a capacitive memory structure included (e.g., integrated) in a gate structure of the FET, as a memory cell.

According to various aspects, a plurality of memory cells may form a memory cell arrangement, e.g. the plurality of memory cells may be arranged in a matrix disposition to form a two-dimensional memory cell arrangement. In a memory cell arrangement, each memory cell may be addressable via respective control lines, e.g. write voltages and/or readout voltages may be provided at a memory cell via the respective control lines. Illustratively, a write operation may include providing a write voltage drop at a memory cell via supplying one or more write voltages via the control lines corresponding to that memory cell. A write operation may also be referred to herein as writing or writing operation. A readout operation may include providing a readout voltage drop at a memory cell via supplying one or more readout voltages via the control lines corresponding to that memory cell. A readout operation may also be referred to herein as reading or reading operation.

In some aspects, a memory cell circuit (e.g., including one memory cell) or a memory cell arrangement (e.g., an array including a plurality of memory cells) may be operated based on one or more write operations (e.g., program and/or erase operations) and/or one or more readout operations. During a write operation, as example, predefined voltages may be provided to electrical lines (also referred to as control-lines or driver-lines), wherein the electrical lines may be connected to the respective terminals of a memory cell (e.g., of each memory cell) to allow for the desired operation. The electrical lines may be referred to, for example, as word-lines, source-lines, and/or bit-lines.

One approach to program and/or erase a plurality of memory cells may be a "one-third (⅓) voltage scheme". Such a ⅓ voltage scheme may realize that one-third of a programming voltage (the programming voltage may be also referred to as write voltage) is only substantially exceeded at terminals corresponding to one or more memory cells that are intended to be written (e.g., programmed or erased). All memory cells that are not intended to be written may see a voltage that is at least substantially equal to or less than one-third of the programming voltage. The programming voltage may be defined by the type and/or design of memory cell. In some aspects, the programming voltage may be in the range from about 1 V to about 10 V. The programming voltage may be determined via one or more electrical measurements. Various timings may be used to provide the respective voltages, e.g., to provide the desired write voltages and/or the desired readout voltages.

Various aspects may be based on the realization that carrying out a write operation on one or more memory cells of a memory cell arrangement (illustratively, one or more "actively addressed" memory cells, also referred to herein as active memory cells) may have an influence also on other memory cells of the memory cell arrangement that are not the (intentional) subject of the write operation (other memory cells that are not being written and not intended to be written, but are "passively influenced", also referred to herein as passive memory cells).

Supplying one or more write voltages to the (active) memory cells that are intended to be written may cause, inherently, one or more voltage drops being present at the (passive) memory cells that are not intended to be written. Illustratively, the active memory cells and the passive memory cells may share one or more control lines (e.g., may be connected to one or more same control lines), so that supplying one or more (write) voltages to the active memory cells may inherently include supplying one or more voltages to the passive memory cells. The one or more voltage supplied to the passive memory cells during writing of the active memory cells may provide a respective voltage drop at the passive memory cells (e.g., a voltage drop over the respective spontaneous-polarizable memory layer). Such voltage drop may be referred to herein as "disturb voltage drop". A disturb voltage drop may be understood as a voltage drop being (unintentionally) provided at a memory cell of a memory cell arrangement during a write operation being carried out on another memory cell of the memory cell arrangement.

A disturb voltage drop may have a negative effect on the properties of a memory cell, illustratively may cause a disturb on the memory cell. The effect of the disturb voltage drop on a memory cell may be dependent on the type of memory cell (e.g., n-type or p-type) and on the memory state the memory cell is residing in (e.g., HVT state or LVT state), as described in further detail below.

As an example, a disturb voltage drop may increase a magnitude of a remanent polarization associated with the memory cell (e.g., a remanent polarization of the spontaneous-polarizable memory layer), causing a so-called "imprint" or "imprint effect". The imprint may render the memory state in which the memory cell is residing preferred (e.g., more energetically favorable) over any other possible memory state. The presence of an imprinted memory state may be detrimental for future writing operations carried out on the memory cell, e.g. a greater voltage drop may be required to switch the memory state of an imprinted memory cell.

As another example, a disturb voltage drop may decrease the magnitude of the remanent polarization associated with the memory cell (e.g., the remanent polarization of the spontaneous-polarizable memory layer). The overall polarization of a memory layer may be defined by the individual contributions of the grains forming the layer. A memory layer being in a polarization state may be understood as a combination (e.g., a sum, or an overlay) of the individual polarizations of the grains forming the memory layer defining that polarization state. Some of the grains of a memory layer may be in an unstable polarization state, e.g. may be in a state that is not robust against switching. The disturb voltage drop may cause an undesired switching (in other words, an undesired flipping) of the polarization state of the weakly polarized grains of the memory layer, thus reducing the overall polarization. The reduction in the overall polarization may be detrimental for a readout of the memory cell, e.g. in the case that the magnitude of the polarization of the memory layer is no longer sufficient to define a desired threshold voltage associated with that memory state.

In the following, a decrease of a magnitude of the remanent polarization (e.g., of a memory layer) may be referred to simply as decrease of the remanent polarization. In a similar fashion, an increase of a magnitude of the remanent polarization (e.g., of a memory layer) may be referred to simply as increase of the remanent polarization.

The effect of the disturb voltage drop(s) on a memory cell may cumulate over time. Illustratively, consecutive write operations carried out on a memory cell of the memory cell arrangement may provide consecutive disturb voltage drops at another memory cell, thus providing a greater and greater decrease or a greater and greater increase of the amplitude of the remanent polarization associated with the other memory cell.

Various aspects may be related to a counter-disturb operation to be carried out on the memory cells of a memory cell arrangement, e.g. on one or more memory cells disturbed during the writing of one or more other memory cells of the memory cell arrangement. The counter-disturb operation may be configured to compensate (e.g., to counteract, to reduce, or to eliminate) the effect of the disturb caused at a memory cell by the writing of another memory cell. Illustratively, the counter-disturb operation may be configured to compensate the decrease of the remanent polarization (e.g., by partially polarizing the memory cell) or the increase of the remanent polarization (e.g., by partially depolarizing the memory cell) associated with the disturbed memory cell. In various aspects, the counter-disturb operation may include providing a counter-disturb voltage drop at one or more memory cells of a memory cell arrangement that have been disturbed during the writing of one or more other memory cells of the memory cell arrangement. The counter-disturb voltage drop may be configured to counterbalance the effect of the disturb voltage drop experienced by the one or more memory cells during the writing of the one or more other memory cells.

Various aspects are related to a control circuit that is configured to carry out writing operations and counter-disturb operations on the memory cells of a memory cell arrangement. The counter-disturb operation may include supplying a counter-disturb signal set (e.g., including one or more counter-disturb voltages) to the memory cells of the memory cell arrangement to compensate the effect of a previously carried out writing operation. The counter-disturb operation may induce a controlled (weak) polarization or (weak) depolarization of the spontaneous-polarizable memory layer of the memory cells that were disturbed in a previous writing operation, e.g. a polarization or depolarization that does not switch the memory state the memory cell(s) is/are residing in but only compensates the previously experienced disturb.

The counter-disturb operation may illustratively include providing a counter-disturb voltage drop at one or more memory cells of a memory cell arrangement to weakly polarize or weakly depolarize the respective memory layer for compensating a depolarization or polarization (respectively) of the memory layer induced by a (previous) write operation (e.g., a previous write operation for writing one or more other memory cells of the memory cell arrangement).

According to various aspects, a memory cell arrangement may include: a plurality of spontaneous-polarizable memory cells; and a control circuit configured to cause a writing of one or more first memory cells of the plurality of spontaneous-polarizable memory cells by a writing operation, wherein the writing operation includes: supplying a write signal set to the plurality of spontaneous-polarizable memory cells to provide a write voltage drop at each of the one or more first memory cells to bring each of the one or more first memory cells into a memory state of at least two memory states by switching a respective polarization state of each of the one or more first memory cells, the write signal set causing (e.g., unintentionally providing) a disturb voltage drop at one or more second memory cells of the plurality of spontaneous-polarizable memory cells that are not intended to be written, wherein the disturb voltage drop causes a disturb of the one or more second memory cells and maintains a respective polarization state of each of the one or more second memory cells; and wherein the control circuit is further configured to supply a counter-disturb signal set to the plurality of spontaneous-polarizable memory cells, wherein the counter-disturb signal set provides a counter-disturb voltage drop at the one or more second memory cells to at least partially compensate the disturb caused by the write signal set.

According to various aspects, a memory cell arrangement may include: a first set of spontaneous-polarizable memory cells and a second set of spontaneous-polarizable memory cells, wherein the memory cells of the first set of memory cells are corresponding to a first word-line, and wherein the memory cells of the second set of memory cells are corresponding to a second word-line; and a control circuit configured to: cause a writing of one or more memory cells of the first set of memory cells by a writing operation, wherein the writing operation comprises supplying a write signal set to the first set of memory cells and to the second set of memory cells, wherein the write signal set provides a write voltage drop at each of the one or more memory cells of the first set of memory cells intended to be written to bring the one or more memory cells into a memory state of at least two memory states by switching a respective polarization state of each of the one or more memory cells, wherein the write signal set causes a disturb at the memory cells of the second set of memory cells that are not intended to be written; and wherein the control circuit is further configured to supply a counter-disturb signal set to the first set of memory cells and to the second set of memory cells, wherein the counter-disturb signal set provides a counter-disturb voltage drop at each memory cell of the second set of memory cells to at least partially compensate the disturb caused by the write signal set.

According to various aspects, a memory cell arrangement may include: a plurality of memory cells, each memory cell including a respective spontaneous-polarizable memory layer, and a control circuit configured to: cause a writing of one or more first memory cells of the plurality of memory cells, wherein writing the one or more first memory cells causes a disturb of one or more second memory cells of the plurality of memory cells that are not being written, and compensate the disturb caused by the writing of the one or more first memory cells by polarizing or at least partially depolarizing the spontaneous-polarizable memory layer of the one or more second memory cells.

According to various aspects, a memory cell arrangement may include: a first spontaneous-polarizable memory cell and a second spontaneous-polarizable memory cell, and a control circuit configured to: cause a writing of the first memory cell, wherein the writing the first memory cell causes a disturb at the second memory cell, and (at least partially) compensate the disturb caused by the writing of the first memory cell by polarizing or at least partially depolarizing the second memory cell.

According to various aspects a method of operating a memory cell arrangement is provided, the memory cell arrangement including a plurality of memory cells, each memory cell including a (respective) spontaneous-polarizable memory layer, the method including: causing a writing of one or more first memory cells of the plurality of memory cells by a writing operation, wherein the writing operation includes supplying a write signal set to the plurality of memory cells, wherein the write signal set provides a write voltage drop at the one or more first memory cells to bring the one or more first memory cells into a memory state of at least two memory states by polarizing the respective spontaneous-polarizable memory layer, wherein the write signal set causes a disturb voltage drop at one or more second memory cells of the plurality of memory cells that are not being written, the disturb voltage drop causing a disturb of the one or more second memory cells; and supplying a counter-disturb signal set to the plurality of memory cells, wherein the counter-disturb signal set provides a counter-disturb voltage drop at the one or more second memory cells to compensate the disturb caused by the write signal set.

According to various aspects a method of operating a memory cell arrangement is provided, the memory cell arrangement including a plurality of spontaneous-polarizable memory cells, the method including: partially polarizing or partially depolarizing one or more second memory cells of the plurality of spontaneous-polarizable memory cells to compensate a respective partial depolarization or partial polarization caused by a writing operation on one or more first memory cells of the plurality of spontaneous-polarizable memory cells.

The term "switch" may be used herein to describe a modification of a polarization, for example of a spontaneous-polarizable memory layer. For example, a polarization of a spontaneous-polarizable memory layer may be switched, such that the polarization varies from pointing towards a first direction to pointing towards the opposite (second) direction, e.g. the sign of the polarization varies from positive to negative or from negative to positive, while the absolute value of the polarization may remain in some aspects substantially unaltered. The term "switch" may also be used herein to describe a modification of the memory state a memory cell is residing in. For example, in the case that a memory cell is residing in a first memory state (e.g., a LVT state), the memory state the memory cell is residing in may be switched such that, after the switch, the memory cell may reside in a second memory state (e.g., a HVT state), different from the first memory state. The term "switch" may thus be used herein to describe a modification of the memory state a memory cell is residing in, from a first memory state to a second memory state. The terms "flip", "flipped", or "flipping" may be used herein in a same manner as the terms "switch", "switched", or "switching".

The term "voltage" may be used herein with respect to "one or more write voltages", "one or more counter-disturb voltages", "one or more disturb voltages", "one or more gate voltages", "a base voltage", "one or more source/drain voltages", and the like. As an example, the term "gate voltage" may be used herein to denote a voltage that is provided at to a gate node or a gate terminal of a transistor or a memory cell, as examples. As another example, the term "base voltage" may be used herein to denote a reference voltage and/or a reference potential for the circuit. With respect to an electrical circuit, the base voltage may be also referred to as ground voltage, ground potential, virtual ground voltage, or zero volts (0 V). The base voltage of an electrical circuit may be defined by the power supply used to operate the electronic circuit. As another example, the term "source/drain voltage" may be used herein to denote a voltage that is provided at a source/drain node or a source/drain terminal of a transistor or a memory cell, as examples.

A voltage provided at a node of the circuit may be defined by the respective potential applied to that node relative to the base voltage (referred to as $V_B$) of the circuit. Further, a voltage drop provided at a certain element (e.g., at a memory cell, at a capacitive memory structure, at a field-effect transistor structure, etc.) may describe a difference between two voltages/potentials provided at the element, e.g., provided directly or indirectly. As an example, a voltage drop provided at an element may include a difference between two voltages/potentials provided at two different nodes or terminals of the element. As another example, a voltage drop provided at an element may include a difference between two voltages/potentials provided at two different locations in a circuit that lead to a voltage drop occurring over the element (e.g., via one or more additional elements). For example, a voltage drop associated with two distinct nodes of a circuit may be defined by the respective voltages/potentials applied at the two nodes. As an example, a gate-source voltage drop associated with a gate structure (e.g. of a transistor or a memory cell) may be defined by the respective voltages/potentials applied at the corresponding gate node and source node of the gate structure. The gate-source voltage drop may also be referred to as gate-source voltage, $V_{GS}$. In the case that the source voltage is zero, as used for example in conventional driving schemes for writing and/or reading of a field-effect transistor based memory cell, the gate-source voltage drop and the gate-source voltage, $V_{GS}$, may be referred to as gate voltage, $V_G$.

In some aspects, two voltages may be compared with one another by relative terms such as "greater", "higher", "lower", "less", or "equal", for example. It is understood that, in some aspects, a comparison may include the sign (positive or negative) of the voltage value or, in other aspects, the absolute voltage values (also referred to as the magnitude, or as the amplitude, e.g. of a voltage pulse) may be considered for the comparison. As an example, an n-type or p-type field-effect transistor based memory cell may have a first threshold voltage, also referred to as low threshold voltage ($V_{L-th}$), and a second threshold voltage, also referred to as high threshold voltage ($V_{H-th}$). In the case of the n-type field-effect transistor (n-FET) based memory cell, the high threshold voltage, $V_{H-th}$, may be greater than the low threshold voltage, $V_{L-th}$, both with respect to the voltage value and the absolute voltage value (e.g. the $V_{L-th}$ may be 1 V and the $V_{H-th}$ may be 3 V, only as numerical examples), or the high threshold voltage, $V_{H-th}$, may be greater than the low threshold voltage, $V_{L-th}$, only with respect to the voltage value (e.g. the $V_{L-th}$ may be −1 V and the $V_{H-th}$ may be 1 V, or the $V_{L-th}$ may be −2 V and the $V_{H-th}$ may be 0 V, or the $V_{L-th}$ may be −3 V and the $V_{H-th}$ may be −1 V, only as numerical examples). In the case of the p-type field-effect transistor (p-FET) based memory cell, the high threshold voltage, $V_{H-th}$, may be lower than the low threshold voltage, $V_{L-th}$, with respect to the voltage value and higher than the low threshold voltage, $V_{L-th}$, with respect to the absolute voltage value (e.g. the $V_{L-th}$ may be −1 V and the $V_{H-th}$ may be −3 V, only as numerical examples), or the high threshold voltage, $V_{H-th}$, may be lower than the low threshold voltage, $V_{L-th}$, only with respect to the voltage value (e.g. the $V_{L-th}$ may be 1 V and the $V_{H-th}$ may be −1 V, or the $V_{L-th}$ may be 2 V and the $V_{H-th}$ may be 0 V, or the $V_{L-th}$ may be 3 V and the $V_{H-th}$ may be 1 V, only as numerical examples).

FIG. 1 shows a schematic functioning of a capacitive memory structure 100, according to various aspects. The capacitive memory structure 100 may include one or more electrodes 102, 106 (e.g., one or more electrode layers, e.g. a first electrode 102 and a second electrode 106 in the configuration in FIG. 1) and a memory element 104 coupled to the one or more electrodes 102, 106. The memory element 104 may include or may be a memory layer disposed between two electrode layers 102, 106. The memory element 104 may include or may consist of a spontaneous-polarizable material. Therefore, the capacitive memory structure 100 may have a capacitance, $C_{CAP}$, associated therewith. The one or more electrodes 102, 106 (e.g., the two electrodes 102, 106 in a capacitor arrangement) and the memory element 104 may form a memory layer stack 100s. In some aspects, the memory layer stack 100s may be a planar layer stack; however, other shapes may be provided as well, e.g., curved shapes, angled shapes, coaxially aligned shapes, as examples.

In some aspects, the capacitive memory structure 100 itself may be used as a memory cell in a memory cell arrangement. In other aspects, the capacitive memory structure 100 may be coupled to or integrated in another device, e.g., a field-effect transistor, and the combination of the capacitive memory structure 100 and the other device may be used as a memory cell in a memory cell arrangement. A memory element that includes or consists of a spontaneous-polarizable material, may be referred to as spontaneous-polarizable memory element. A memory layer that includes or consists of a spontaneous-polarizable material may be referred to as spontaneous-polarizable memory layer (e.g., a remanent-polarizable memory layer in the case of a remanent-polarizable material). According to various aspects, a memory element 104 may include one or more memory layers. As an example, a spontaneous-polarizable memory element 104 may include one or more spontaneous-polarizable memory layers. In the following, reference to a memory layer (e.g., to the memory layer 104) may be understood to apply to a spontaneous-polarizable memory layer (for example, a ferroelectric memory layer or an anti-ferroelectric memory layer).

The at least one memory element 104 may include any type of spontaneous-polarizable material, such as a ferroelectric material, an anti-ferroelectric material, a ferroelectric-like material, an anti-ferroelectric-like material, etc. The at least one memory element 104 may be the memory layer of the capacitive memory structure 100 to store, for example, an information via at least two remanent polarization states of the at least one memory element 104. The programming of the capacitive memory structure 100 (illustratively the storage of information therein) may be carried out by providing an electric field at the capacitive memory structure, e.g. an electric field between the first electrode 102 and the second electrode 106 (e.g., an electric potential difference between a first node and a second node associated with the first electrode 102 and the second electrode 106, respectively, to provide a voltage drop over the memory element 104) to thereby set or change the remanent polarization state of the at least one memory element 104.

The capacitive memory structure 100 including the memory element 104 may be used to implement memory functions. The feature and functionalities described herein with reference to a memory cell, e.g., with reference to a FeFET, may be implemented in the same or in a similar way in a capacitive memory structure 100, e.g., in a FeCAP, that can act as a memory cell.

In various aspects, the polarization state of the memory element 104 may be switched by means of the capacitor structure. The polarization state of the memory element 104 may also be read out by means of the capacitor structure. The polarization state of the memory element 104 may define a memory state. As an example, the polarization state of a spontaneous-polarizable memory layer 104 may determine the amount of charge stored in the capacitor structure. The amount of charge stored in the capacitor structure may be used to define a memory state (e.g., a first amount of charge, for example less than 500 μC (but not limited to such a value), stored in the capacitor structure may define a first memory state, such as a LVT state, and a second amount of charge, for example greater than 500 μC (but not limited to such a value), stored in the capacitor structure may define a second memory state, such as a HVT state). For example, a memory cell including the capacitive memory structure 100 may operate without having a field-effect transistor structure included in the memory cell, e.g. without basing the operation on a variation of a threshold voltage of a field-effect transistor structure.

Figure 2:
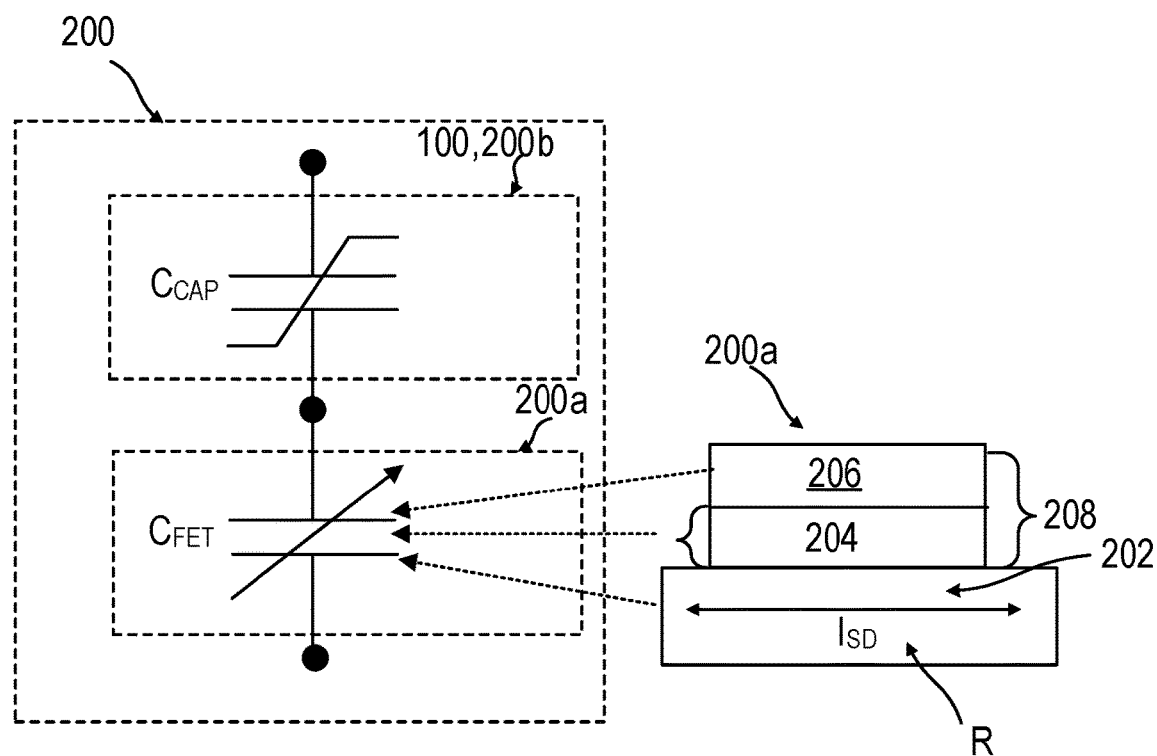
FIG. 2 shows schematically an equivalent circuit diagram of a memory cell including a capacitive memory structure, according to various aspects.

FIG. 2 shows a circuit equivalent of a memory cell 200 including a field-effect transistor structure 200a and a capacitive memory structure 200b, according to various aspects. The capacitive memory structure 200b may be configured as described with reference to the capacitive memory structure 100 illustrated in FIG. 1, e.g., including one or more electrodes 102, 106 and a memory element 104 coupled to the one or more electrodes 102, 106 (for example, including a first electrode 102, a second electrode 106, and a spontaneous-polarizable memory layer 104, disposed between the first electrode 102 and the second electrode 106). In some aspects, the field-effect transistor structure 200a (e.g., a gate stack 208 of the field-effect transistor structure 200a, also referred to as gate structure) may be coupled to the capacitive memory structure 200b. In other aspects, the capacitive memory structure 200b may be integrated in the field-effect transistor structure 200a, e.g. within the gate stack 208 of the field-effect transistor structure 200a.

The field-effect transistor structure 200a may include a gate structure 208, wherein the gate structure 208 may include a gate isolation 204 and a gate electrode 206. The gate structure 208 is illustrated exemplarily as a planar gate stack; however, it may be understood that the planar configuration shown in FIG. 2 is an example, and other field-effect transistor designs may include a gate structure 208 with a non-planar shape, for example a trench gate transistor design, a vertical field-effect transistor design, or other designs.

The gate structure 208 may define a channel region 202, e.g., provided in a semiconductor portion (e.g., in a semiconductor layer, in a semiconductor die, etc.). The gate structure 208 may allow for a control of an electrical behavior (e.g., a resistance R) of the channel region 202, e.g., a current flow in the channel region 202 may be controlled (e.g., allowed, increased, prevented, decreased, etc.). In some aspects, the gate structure 208 may, for example, allow to control (e.g., allow or prevent) a source/drain current, $I_{SD}$, from a first source/drain region of the field-effect transistor structure 200a to a second source/drain region of the field-effect transistor structure 200a (the source/drains are provided in or adjacent to the channel but are not shown in FIG. 2). The channel region 202 and the source/drain regions may be formed, e.g., via doping one or more semiconductor materials or by the use of intrinsically doped semiconductor materials, within a layer and/or over a layer.

With respect to the operation of the field-effect transistor structure 200a, a voltage may be provided at the gate electrode 206 to control the current flow, $I_{SD}$, in the channel region 202, the current flow, $I_{SD}$, in the channel region 202 being caused by voltages supplied via the source/drain regions. The gate electrode 206 may include an electrically conductive material (e.g., a metal material). In some aspects, the gate electrode 206 may be coupled to the capacitive memory structure 200b (e.g., may be coupled to an electrode, e.g. to the first electrode 102, of the capacitive memory structure). According to various aspects, the gate isolation 204 may be configured to provide an electrical separation of the gate electrode 206 from the channel region 202 and further to influence the channel region 202 via an electric field generated by the gate electrode 206. The gate isolation 204 may include one or more electrically insulating layers, as an example.

As an example, the gate electrode 206 of the field-effect transistor structure 200a may be electrically conductively connected to the first electrode of the capacitive memory structure 200b via an electrically conductive (e.g., ohmic) connection. As another example, the first electrode of the capacitive memory structure 200b may be in direct physical contact with the gate electrode 206 of the field-effect transistor structure 200a. As a further example, the capacitive memory structure 200b and the field-effect transistor structure 200a may share a common electrode acting as gate electrode of the field-effect transistor structure 200a and as electrode of the capacitive memory structure 200b.

As illustrated by the circuit equivalent in FIG. 2, a first capacitance, $C_{FET}$, may be associated with the field-effect transistor structure 200a. Illustratively, the channel region 202, the gate isolation 204, and the gate electrode 206 may have a capacitance, $C_{FET}$, associated therewith, originating from the more or less conductive regions (the channel region 202 and the gate electrode 206) separated from one another by the gate isolation 204. The channel region 202 may be considered as a first capacitor electrode, the gate electrode 206 as a second capacitor electrode, and the gate isolation 204 as a dielectric medium between the two capacitor electrodes. In some aspects, the field-effect transistor structure 200a and the capacitive memory structure 100, 200b may be coupled (e.g., electrically connected) to one another such that a capacitive voltage divider is provided, as illustrated by the circuit equivalent in FIG. 2. The channel or bulk node of the field-effect transistor structure 200a may provide or may be connected to a first node, an electrode of the capacitive memory structure 100, 200b may provide or may be connected to a second node, and an intermediate conductive portion (electrode, layer, etc.) may provide or may be connected to a floating intermediate node.

According to various aspects, a ferroelectric material may be used as part of a capacitive memory structure of a memory cell (e.g., as part of the capacitive memory structure 100, or of the capacitive memory structure 200b of the memory cell 200). A ferroelectric material may be an example of material of a memory layer (e.g., of the memory layer 104). Illustratively, ferroelectric materials may be used to store data in non-volatile manner in integrated circuits. The term "ferroelectric" may be used herein, for example, to describe a material that shows a hysteretic charge voltage relationship (Q-V). Doped or substituted hafnium oxide ($HfO_2$), doped or substituted zirconium oxide ($ZrO_2$) or, more in general, transition-metal-oxides (TMO) and their mixtures may show great remanent polarization under certain process conditions (e.g., $Hf_{0.5}Zr_{0.5}O_2$ may possess strong ferroelectric properties). However, the choice of material for a memory layer is not limited to ferroelectric materials.

The material of a memory layer (e.g., as part of a capacitive memory structure 100, and/or of a memory cell 200) may be or may include at least one of the following: a doped transition metal oxide, an undoped transition metal oxide, a doped transition metal nitride, an undoped transition metal nitride, a doped metal nitride (e.g., aluminum nitride), and/or an undoped metal nitride. As an example, the material of a memory layer may be or may include hafnium oxide (ferroelectric hafnium oxide, $HfO_2$), zirconium oxide (ferroelectric zirconium oxide, $ZrO_2$), and/or a (ferroelectric) mixture of hafnium oxide and zirconium oxide. Ferroelectric hafnium oxide may include any form of hafnium oxide that may exhibit ferroelectric properties. Ferroelectric zirconium oxide may include any form of zirconium oxide that may exhibit ferroelectric properties. This may include, for example, hafnium oxide, zirconium oxide, a solid solution of hafnium oxide and zirconium oxide (e.g., but not limited to it, a 1:1 mixture) or hafnium oxide and/or zirconium oxide doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide or zirconium oxide. The ferroelectric material may be doped at a concentration from about 2 mol % to about 6 mol %, only as an example. As another example, the material of a memory layer may be or may include scandium nitride.

According to various aspects, a memory cell (e.g., a memory cell 100, 200), may have at least two distinct memory states associated therewith, for example with two distinct electrical conductivities or two distinct amounts of stored charge that may be determined (e.g., measured) to determine in which of the at least two distinct memory states the memory cell is residing in. According to various aspects, a memory state the memory cell is residing in may be a "programmed state" or an "erased state". As an example, the programmed state may be an electrically conducting state or a state with positive stored charge (e.g., associated with a logic "1") and the erased state may be an electrically non-conducting state or a state with negative stored charge (e.g., associated with a logic "0"). However, the definition of programmed state and erased state may be selected arbitrarily.

The remanent polarization of the memory layer may define the memory state a memory cell is residing in. According to various aspects, a memory cell may reside in a first memory state in the case that the memory layer is in a first polarization state, and the memory cell may reside in a second memory state in the case that the memory layer is in a second polarization state (e.g., opposite to the first polarization state).

The threshold voltage of a field-effect transistor structure (e.g., of the field-effect transistor structure 200a) may be a function of the amount and/or polarity of charge stored in the capacitive memory structure, e.g. on the polarization state of the memory layer of the capacitive memory structure. A first threshold voltage, e.g. the low threshold voltage $V_{L\text{-}th}$, may be associated with the first polarization state (e.g., with the first amount and/or polarity of stored charge), and a second threshold voltage, e.g. the high threshold voltage $V_{H\text{-}th}$, may be associated with the second polarization state (e.g., with the second amount and/or polarity of stored charge). Illustratively, the first memory state may be associated with the first threshold voltage (e.g., the first memory state may be referred to as LVT state), and the second memory state may be associated with the second threshold voltage (e.g., the second memory state may be referred to as HVT state).

According to various aspects, writing a memory cell or performing a write operation of a memory cell may include an operation or a process that modifies the memory state the memory cell is residing in from a (e.g., first) memory state to another (e.g., second) memory state. According to various aspects, writing a memory cell may include programming a memory cell (e.g., performing a programming operation of a memory cell), wherein the memory state the memory cell is residing in after programming may be called "programmed state". For example, programming an n-type FET based memory cell may modify the state the memory cell is residing in from the HVT state to the LVT state, whereas programming a p-type FET based memory cell may modify the state the memory cell is residing in from the LVT state to the HVT state. According to various aspects, writing a memory cell may include erasing a memory cell (e.g., performing an erasing operation of a memory cell), wherein the memory state the memory cell is residing in after the erasing may be called "erased state". For example, erasing an n-type FET based memory cell may modify the state the memory cell is residing in from the LVT state to the HVT state, whereas erasing a p-type FET based memory cell may modify the state the memory cell is residing in from the HVT state to the LVT state.

The readout of a memory cell including a field-effect transistor structure (e.g., the readout of the memory cell 200) may include providing a readout voltage drop at the memory cell, and measuring a current (e.g., a source-drain current) output from the memory cell. The memory state the memory cell is residing in may be determined as a function of the measured current. In the case that the memory cell is residing in a non-conducting state (e.g., in the HVT state) a first (relatively lower) amount of current may be measured, and in the case that the memory cell is residing in a conducting state (e.g., in the LVT state) a second (relatively higher) amount of current may be measured.

Figure 3:
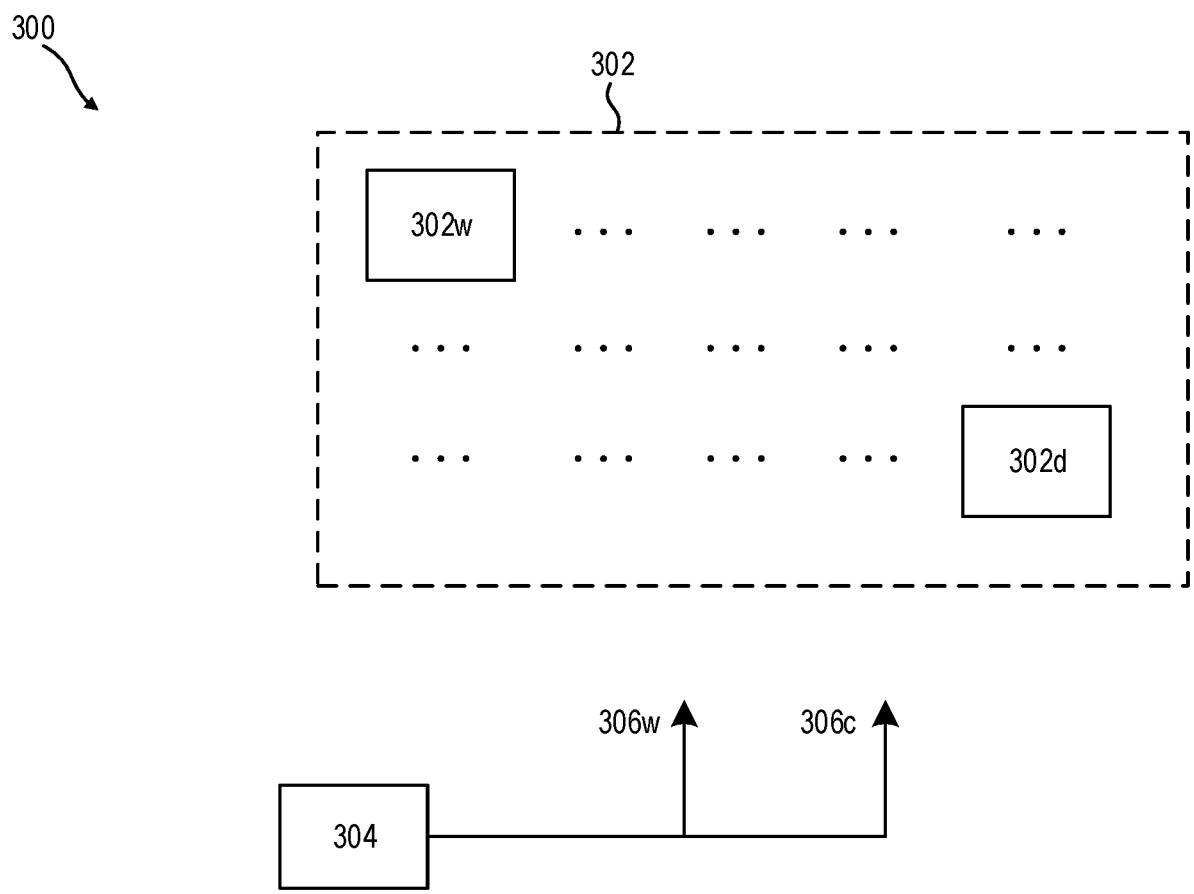
FIG. 3 shows a memory cell arrangement in a schematic view according to various aspects.

FIG. 3 illustrates schematically an exemplary configuration of a memory cell arrangement 300, according to various aspects. The memory cell arrangement 300 may include a plurality of memory cells 302, e.g. a plurality of spontaneous-polarizable memory cells 302. In the simplified representation in FIG. 3, only two memory cells (a first memory cell 302w and a second memory cell 302d) are shown, to illustrate the principles of the counter-disturb operation. It is however understood that the memory cell arrangement 300 may include any number of memory cells (e.g., to implement a desired storage size). The memory cells 302 (e.g., at least one, or each, of the memory cells 302) may be configured as the capacitive memory structure 100 and/or as the memory cell 200 described in relation to FIG. 1 and FIG. 2. Illustratively, each memory cell 302 may include a respective spontaneous-polarizable memory layer.

Various aspects may be based on the realization that in a memory cell arrangement 300, the addressing (e.g., the writing) of one or more memory cells 302 may have an influence also on the other memory cells 302 that are not intended to be written. Illustratively, the addressing of "active" memory cells may influence the properties (e.g., the remanent polarization) of the other "passive" memory cells that are not the intentional target of the write operation. In the following, reference may be made to the writing of a (first) memory cell 302w and to the disturb of another (second) memory cell 302d (a disturbed memory cell 302d). The addressing of the memory cell 302w may "disturb" the other memory cell 302d, and lead over time to an undesired polarization or undesired depolarization of the other memory cell, e.g. of the memory layer of the other memory cell 302d. It is however understood that the aspects described herein may correspondingly apply to writing of more than one memory cell 302w (e.g., to the simultaneous writing of two, three, four, five, or more than five memory cells 302w) and to the disturb (and counter-disturb) of more than one memory cell 302d (e.g., to the simultaneous disturb of two, three, four, five, or more than five memory cells 302d). The disturb of "passive" memory cells related to the writing of "active" memory cells will be described in further detail in relation to FIG. 4A to FIG. 4D.

In various aspects, the memory cell arrangement 300 may be configured to carry out a counter-disturb operation (e.g., after a writing operation, for example less than 1 minute after, or less than 10 seconds after, or less than 500 ms after), in which a counter-disturb is provided at the memory cell(s) 302d affected by the writing of another memory cell 302w (or other memory cells) in the writing operation. The counter-disturb operation may be configured to at least partially remedy the undesired polarization or depolarization of the passive memory cell(s) 302d by providing a corresponding depolarization or polarization of the passive memory cell(s) 302d (e.g., of the respective memory layer).

According to various aspects, the memory cell arrangement 300 may include a control circuit 304 configured to carry out and/or instruct one or more writing operations associated with a writing of the memory cells 302 of the memory cell arrangement 300. The control circuit 304 may be further configured to carry out and/or instruct one or more counter-disturb operations of the memory cells 302 of the memory cell arrangement 300. Examples of a writing operation and a counter-disturb operation will be described in further detail in relation to FIG. 4A to FIG. 4D. In brief, the control circuit 304 may be configured to supply a write signal set 306w to the memory cells 302 of the memory cell arrangement 300 to cause a writing of one or more of the memory cells 302 (e.g., of the memory cell 302w), and the circuit 304 may be configured to supply a counter-disturb signal set 306c to the memory cells 302 of the memory cell arrangement 300 to remedy a disturb at one or more of the memory cells 302 (e.g., at the memory cell 302d). As an example, the control circuit 304 may include or may control one or more voltage supply circuits. The one or more voltage supply circuits may be used for supplying control voltages (e.g., write voltages and counter-disturb voltages) to control-lines of the memory cell arrangement 300 (not shown in FIG. 3), e.g. for supplying voltages to respective control nodes of the memory cells 302 (not shown in FIG. 3). According to various aspects, the control circuit 304 may define a base voltage, $V_B$, e.g. a ground voltage (for example 0 V) associated with the memory cell arrangement 300 (the base voltage, $V_B$, may also be referred to herein as reference voltage, $V_{ref}$).

The control circuit 304 may be configured to cause a writing of one or more (first) memory cells 302w of the plurality of memory cells 302 by a writing operation. The writing operation may include supplying the write signal set 306w to the plurality of memory cells 302 (e.g., a set of voltages, e.g. one or more voltages to the one or more memory cells 302w intended to be written and one or more voltages to the one or more other memory cells 302d not intended to be written, as described in further detail below). The write signal set 306w may provide a write voltage drop at the one or more (first) memory cells 302w intended be written to bring the memory cell(s) 302w into a memory state of at least two memory states by switching a respective polarization state of each of the one or more first memory cells (e.g., by polarizing the respective memory layer, e.g., the respective spontaneous-polarizable memory layer). A write voltage drop may be understood as a voltage drop provided at a memory cell 302w having sufficient magnitude (in other words, sufficient amplitude) to switch the polarization state (and thus the memory state) the memory cell 302w is residing in (or was residing in prior to providing the write voltage drop), e.g. to switch the polarization from a positive remanent polarization to a negative remanent polarization, or vice versa. A write voltage drop may include a voltage drop providing an electric field at the memory cell 302w equal to or greater than a coercive field for switching the polarization of the memory cell.

Various aspects may be based on the realization that the write signal set 306w may cause a (disturb) voltage drop at the one or more other (e.g., second) memory cell(s) 302d of the plurality of memory cells 302 that are not intended to be written. The disturb voltage drop may cause a disturb at the other (passive) memory cell(s) 302d. As an example, the disturb caused by the disturb voltage drop may include a decrease of the remanent polarization associated with the passive memory cell(s) 302d (e.g., a decrease of the remanent polarization of the respective memory layer). Illustratively, the disturb voltage drop may at least partially depolarize each passive memory cell 302d, e.g. the respective memory layer of the passive memory cell(s) 302d. As another example, the disturb caused by the disturb voltage drop may include an increase of the remanent polarization associated with the passive memory cell(s) 302d (e.g., an increase of the remanent polarization of the respective memory layer). Illustratively, the disturb voltage drop may at least partially polarize each passive memory cell 302d, e.g. the respective memory layer of the passive memory cell(s) 302d (illustratively, may cause an imprint of the polarization). In general, the disturb caused by the disturb voltage drop may include a change of a magnitude of a remanent polarization associated with a respective one of the one or more passive (second) memory cells 302d.

The disturb voltage drop may be understood as a voltage drop at a memory cell 302d that causes a partial variation of the polarization state of the memory cell 302d without completely switching the polarization state. The disturb voltage drop may maintain a respective polarization state of each of the one or more second memory cells 302d. Illustratively, the disturb voltage drop may not switch a respective memory state the passive memory cell(s) 302d is/are residing in, e.g. the disturb voltage drop (as provided by the voltages included in the write voltage set 306w) may have a magnitude not sufficient to switch the polarization state of the passive memory cell(s) 302d. In various aspects, the disturb voltage drop may have a magnitude less than the magnitude of the write voltage drop (e.g., the magnitude of the disturb voltage drop may be a fraction of the magnitude of the write voltage drop, e.g. half, or one third, or one sixth, as examples).

The increase or decrease of the remanent polarization associated with the passive memory cell(s) 302d provided by the disturb voltage drop may be dependent on the memory state the passive memory cell(s) 302 is/are residing in. Illustratively, in the case that a passive memory cell 302d is residing in a memory state associated with a polarization oriented towards a first direction, a disturb voltage drop providing an electric field across the memory layer oriented towards the first direction would increase the remanent polarization of the memory cell. A disturb voltage drop an electric field across the memory layer oriented towards a second direction (opposite to the first direction) would instead decrease the remanent polarization of the memory cell. Correspondingly, in the case that a passive memory cell 302d is residing in a memory state associated with a polarization oriented towards the second direction, an electric field in the second direction would increase the remanent polarization, and an electric field in the first direction would decrease the remanent polarization of the memory cell.

As an example, in the case that a passive memory cell 302d has a positive remanent polarization (e.g., the memory cell is in the LVT state), a disturb voltage drop having a positive polarity (e.g., for a n-type memory cell) may increase the remanent polarization of the memory cell 302d, and a disturb voltage drop having a negative polarity may decrease the remanent polarization of the memory cell 302d. As another example, in the case that a passive memory cell 302d is residing in a memory state associated with a negative remanent polarization (e.g., in the HVT state), a disturb voltage drop having a negative polarity (e.g., for a n-type memory cell) may increase the remanent polarization of the memory cell 302d, and a disturb voltage drop having a positive polarity may decrease the remanent polarization of the memory cell 302d. In both cases, a deterioration of the memory properties of the memory cell may be observed, as described above.

In various aspects, the presence of a disturb voltage drop at the memory cell(s) 302d not intended to be written may be related, for example, to the write signal set 306w including one or more inhibit voltages provided at those memory cell(s) 302d. Illustratively, rather than merely keeping the memory cell(s) 302d not intended to be written at the base voltage $V_B$ (e.g., at 0 V), the write operation may include supplying one or more inhibit voltages (e.g., having a different magnitude with respect to base voltage $V_B$) to those memory cell(s) 302d. The one or more inhibit voltages may be configured to ensure that the memory state of the passive memory cell(s) 302d is not switched during the write operation. However, the one or more inhibit voltages may disturb the passive memory cell(s) 302d, as described above.

According to various aspects, the control circuit 304 may be configured to carry out a counter-disturb operation to at least partially compensate the disturb caused on the passive memory cell(s) 302d. The control circuit 304 may be configured to supply the counter-disturb signal set 306c to the plurality of memory cells 302 (e.g., including one or more voltages provided at the memory cell(s) 302w written in the previous write operation, and one or more voltages provided at the memory cell(s) 302d disturbed in the previous write operation). The counter-disturb signal set 306c may provide a counter-disturb voltage drop at the passive memory cell(s) 302d (e.g., a respective counter-disturb voltage drop at each of the one or more second memory cells 302d) to at least partially compensate the disturb caused by the write signal set 306w.

The counter-disturb signal set 306c may be configured in accordance with (e.g., as a function of) the write signal set 306w. Illustratively, the counter-disturb signal set 306c may be configured to provide a (respective) counter-disturb voltage drop at the passive memory cell(s) 302d having opposite polarity with respect to the disturb voltage drop provided at those memory cell(s) during the write operation.

The supplying of the write signal set 306w and of the counter-disturb signal set 306c, with exemplary voltage values, will be described in further detail in relation to FIG. 4A to FIG. 4D, together with an exemplary configuration of a memory cell arrangement.

Figure 4A:
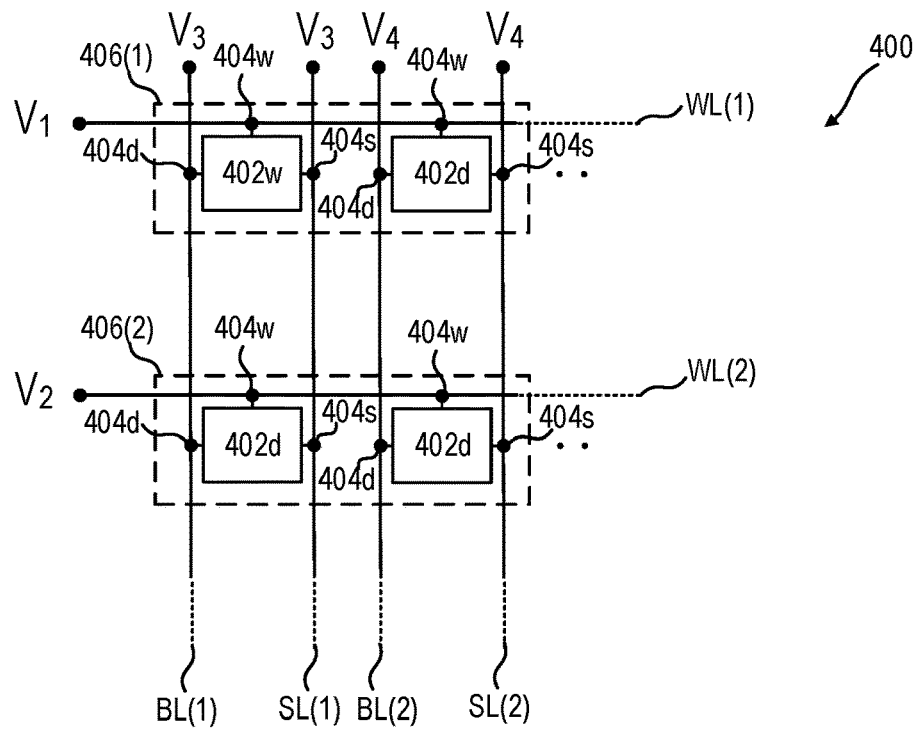
FIG. 4A shows a memory cell arrangement in a schematic view according to various aspects.
Figure 4B:
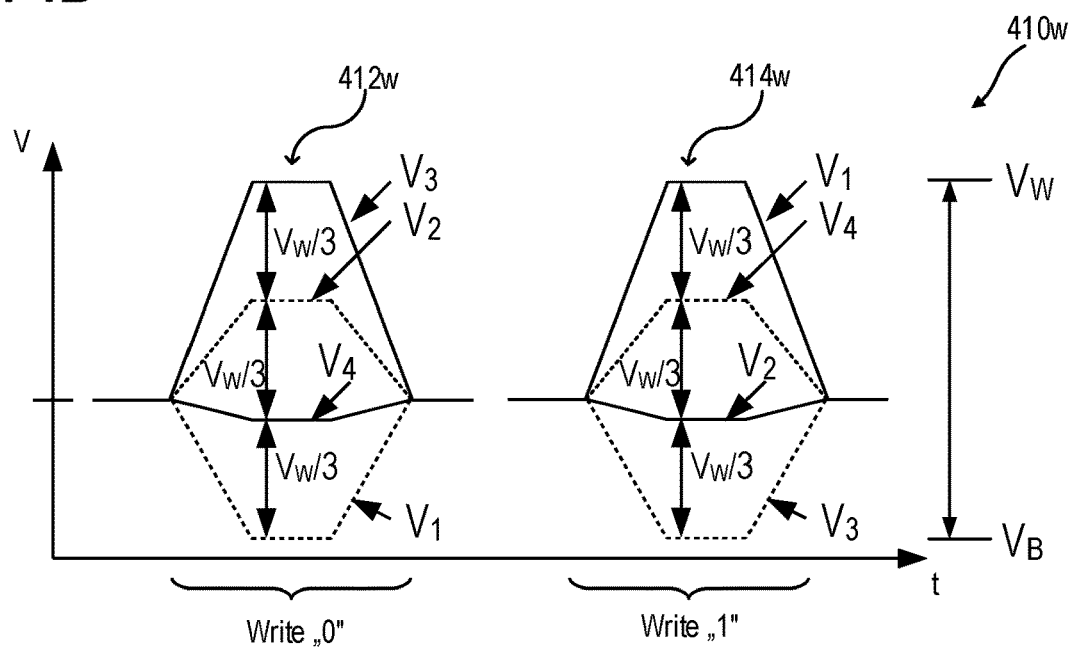
FIG. 4B shows a graph associated with a write signal set according to various aspects.
Figure 4C:
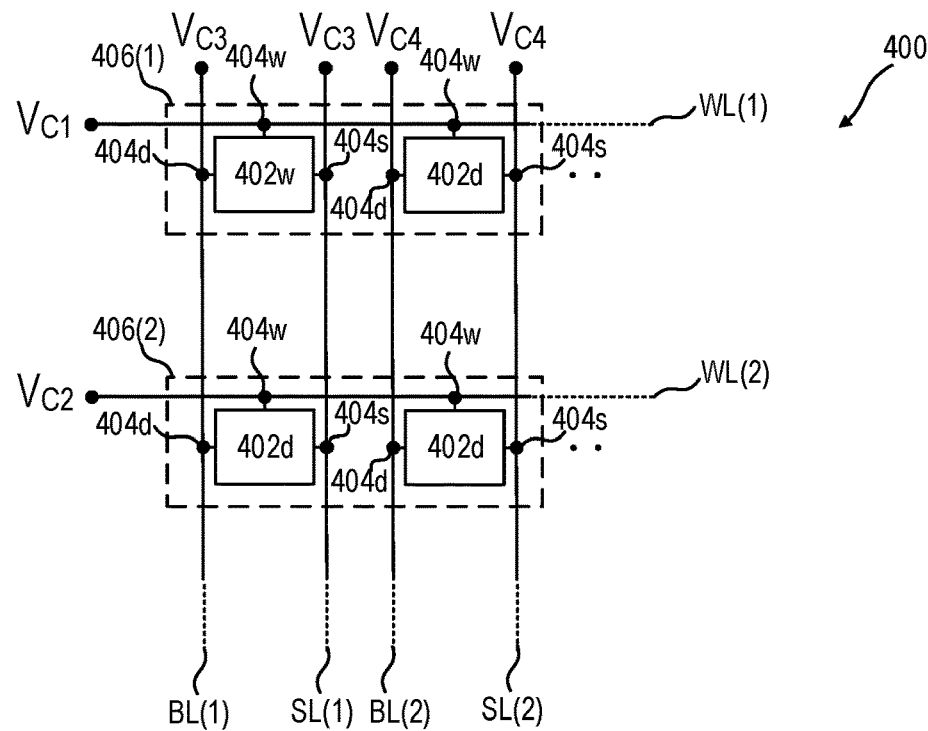
FIG. 4C shows a memory cell arrangement in a schematic view according to various aspects.

FIG. 4A and FIG. 4C illustrate schematically a memory cell arrangement 400 during a write operation (FIG. 4A) and during a counter-disturb operation (FIG. 4C), according to various aspects. The memory cell arrangement 400 may include a plurality of (spontaneous-polarizable) memory cells 402. The memory cell arrangement 400 may be an exemplary configuration of the memory cell arrangement 300, and the memory cell(s) 402 may be an exemplary configuration of the memory cell(s) 302 described in relation to FIG. 3.

The memory cells 402 may be arranged, for example, in a matrix architecture. The memory cells 402 may be arranged in a number, n, of columns and in a number, m, of rows, with m and n integer numbers equal to or greater than 1. FIG. 4A and FIG. 4C illustrate four columns (e.g., first to fourth columns) and two rows (e.g., a first row and a second row) of a memory cell arrangement 400, each column including two memory cells 402, only as an example. The memory cell arrangement 400 may include any suitable number of memory cells 402, arranged in any suitable number, n, of columns and in any suitable number, m, of rows.

At least one (e.g., more than one, or each) memory cell 402 of the plurality of memory cells 402 may include one or more control nodes. As an example, each memory cell 402 may include at least a second control node 404s, a third control node 404d, and a first control node 404w to control an electrical behavior of the second control node 404s and the third control node 404d of the memory cell 402 (e.g., a current flow between the second control node 404s and the third control node 404d).

According to various aspects, at least one (e.g., more than one, or each) memory cell 402 of the plurality of memory cells 402 may be a field-effect transistor (FET) based memory cell, e.g. may include a field-effect transistor structure, and may include two source/drain regions and a gate region (also referred to as gate structure) to control a current flow between the two source/drain region. As an example, a memory cell 402 may include a gate node 404w, a source node 404s, and a drain node 404d. The gate node 404w may be coupled to the gate region of the memory cell 402. The source node 404s may be coupled to the source region of the memory cell 402. The drain node 404d may be coupled to the drain region of the memory cell 402.

It is understood that, in some aspects, the plurality of memory cells 402 (e.g., at least one, or each memory cell 402) may include only a capacitive memory structure without a field-effect transistor structure, as described above. In this configuration, the control nodes of a memory cell 402 may be coupled with the one or more electrodes of the capacitive memory structure. As an example, in this configuration of the memory cells 402, the memory cell arrangement 400 may include a crossbar arrangement, in which each electrode of a memory cell 402 is connected to a corresponding control line.

According to various aspects, the memory cell arrangement 400 may include a plurality of control-lines (e.g., a plurality of word-lines WL, a plurality of bit-lines BL, and a plurality of source-lines SL), coupled to the memory cells 402. The control-lines may be used to supply voltages to control nodes of the memory cells 402. The plurality of control-lines may be arranged in any suitable way defined by the desired architecture of the memory cell arrangement 400 (e.g., by the desired matrix disposition of the memory cells 402). As an example, the first control node 404w of each memory cell 402 may be connected to a corresponding word-line WL, the second control node 404s of each memory cell 302 may be connected to a corresponding source-line SL, and the third control node 404d of each memory cell 302 may be connected to a corresponding bit-line BL. Each memory cell 402 of the plurality of memory cells 402 may be unambiguously assigned to one word-line WL, to one source-line SL, and to one bit-line BL (in other words, to one source/bit-line pair).

In the case that a memory cell 402 includes a field-effect transistor structure, the corresponding source/drain regions of the field-effect transistor structure may be connected to the source/bit-line pair corresponding to the memory cell 402, e.g. one of the two source/drain regions of the field-effect transistor structure may be connected to a bit line BL of a corresponding source/bit line pair, and the other one of the two source/drain regions of the field-effect transistor structure may be connected to a source line SL of the corresponding source/bit line pair. The portion of the memory cell 402 connected to the corresponding word-line WL may depend on the architecture of the memory cell 402. As an example, in the case that the memory cell 402 includes a capacitive memory structure coupled to the field-effect transistor structure, the capacitive structure may be connected to the corresponding word-line WL. As another example, in the case that the memory cell 402 includes a capacitive memory structure included (e.g., integrated) in the gate structure of the field-effect transistor structure, the gate structure may be connected to the corresponding word-line WL.

The plurality of memory cells 402 may be arranged in such a way that the control lines may be shared by more than one memory cell 402 (e.g., by the memory cells 402 disposed in a same row or in a same column of the memory cell arrangement 400). Each source/bit-line pair may be coupled to each memory cell 402 in a same column of memory cells 402, and each word-line WL may be coupled to each memory cell 402 in a same row of memory cells 402.

According to various aspects, at least one (e.g., more than one, or each) memory cell 402 may include an additional (e.g., a fourth) control node. In this case, the memory cell(s) 402 may be assigned to an additional (e.g., fourth) control line, for example to an additional word-line WL (not shown). A four terminal memory cell (also referred to as four node memory cell or four terminal device) may be, for example, a ternary memory cell (e.g., a Ternary Content Addressable Memory (TCAM) cell).

In various aspects, the memory cells 402 of the memory cell arrangement 400 may be logically (and, in some aspects, spatially) divided into one or more sets 406 (in other words, one or more groups) of memory cells 402, e.g. two sets 406(1), 406(2) in the configuration in FIG. 4A and FIG. 4C. A set of memory cells may be understood as one or more memory cells 402 forming a normal unit for storing information. In some aspects, a set of memory cells 402 may be understood as a "word", as known in the art, e.g. as a collection of memory cells 402 (each representing a "bit of information") that may be addressed as a unit (illustratively, together, in parallel). In the configuration in FIG. 4A and FIG. 4C, the sets of memory cells may include memory cells 402 disposed adjacent to one another in the memory cell arrangement 400; it is however understood that a set of memory cells may also include (e.g., may be formed by) memory cells 402 that are not adjacent to one another, as long as an addressing of the memory cells 402 of the set as a unit is possible (as another example, a set of memory cells may include every second memory cell 402 in a same row, or every third memory cell 402 in a same row).

A set of memory cells may include any suitable number of memory cells 402 in accordance with a desired architecture, e.g. in accordance with a desired handling of data stored in the memory cell arrangement 400. As numerical examples, a set of memory cells may include one, two, four, eight, sixteen, thirty-two, or sixty-four memory cells 402 (e.g., providing a one-bit word, a two-bits word, a four-bits word, an eight-bits word, a sixteen-bits word, a thirty-two-bits word, or a sixty-four-bits word, respectively).

The memory cells 402 of a set of memory cells may be corresponding to a same word-line WL (e.g., the respective gate node 404w of each memory cell 402 of a set of memory cells may be connected to the same word-line WL). This may provide addressing the memory cells 402 of the set 406 as a unit (e.g., via providing a common control signal, e.g. a common voltage, at the respective gate node 404w). In some aspects, more than one set of memory cells may be corresponding to a same word-line WL, e.g. a plurality of sets of memory cells may be addressable via the same word-line WL. In this configuration, the sets of memory cells corresponding to a same word-line WL may still be considered as separate sets of memory cells (e.g., as separate words), in accordance with the logical architecture of the memory cell arrangement 400.

Memory cells 402 in different sets of memory cells may share a same source/bit-line pair, e.g. the memory cells 402 of different sets that are disposed along a same column may be corresponding to same source-line SL and a same bit-line BL. In the configuration in FIG. 4A and FIG. 4C, at least one (e.g., more than one, or each) memory cell 402 of the first set 406(1) and at least one (e.g., more than one, or each) memory cell 402 of the second set 406(2) may be corresponding to a same source/bit-line pair (a same bit-line BL(1) and a same source-line SL(1), a same bit-line BL(2) and a same source-line SL(2), etc.).

Memory cells 402 of different sets 406 being connected to the same control line(s) may provide that supplying one or more voltages to one or more memory cells of one set 406 inherently includes supplying one or more voltages to one or more memory cells of another set 406, e.g. providing the disturb described above during a write operation.

In the following, a write operation is described, in relation to FIG. 4A and FIG. 4B considering as memory cell to be written the memory cell 402w in position (1,1) in the array of memory cells 402. It is however understood that the aspects described herein in relation to the memory cell 402w may correspondingly apply to each memory cell intended to be written (e.g., a same write voltage drop may be provided at each memory cell intended to be written). In some aspects, the one or more (first) memory cells intended to be written may be part of a same set of memory cells (e.g., of the first set 406(1), e.g. of a same word).

A write signal set (e.g., the write signal set 306w) may include one or more voltages V1, V2, V3, V4 supplied to the control lines of the memory cell arrangement 400 (and thus to the respective control nodes of the memory cells 402). The write signal set may include one or more voltages V1, V3 supplied to the control lines corresponding to the one or more (first) memory cells intended to be written (e.g., to the first word-line WL(1), the first source-line SL(1), and the first bit-line BL(1) corresponding to the memory cell 402w to be written in the configuration in FIG. 4A). The write signal set may include one or more voltages V2, V4 supplied to the control lines corresponding to the other memory cells 402 of the memory cell arrangement 400, illustratively to one or more (second) memory cells 402 (one or more passive, disturbed, memory cells 402*d*) of the memory cell arrangement 400 that are not being written in the write operation (and are not intended to be written).

The one or more voltages V1, V3 supplied to the control lines corresponding to the one or more (first) memory cells intended to be written may be configured (e.g., selected) to provide the write voltage drop at those memory cell(s) 402*w*. The one or more voltages V2, V4 supplied to the control lines corresponding to the one or more (second) memory cells 402*d* not intended to be written may be configured to provide a voltage drop that does not switch the memory state those memory cells 402*d* are residing in.

FIG. 4B shows a graph 410*w* associated with a write signal set according to various aspects. The graph 410*w* illustrates exemplary voltage values for the voltages V1, V2, V3, V4 supplied to the control lines of the memory cell arrangement 400 for writing one or more (first) memory cells (e.g., the memory cell 402*w*). The graph 410*w* illustrates exemplary voltage values for bringing the memory cell(s) 402*w* into a first memory state, e.g. an erasing operation 412*w* (to write a logic "0"), and exemplary voltage values for bringing the memory cell(s) 402*w* into a second memory state, e.g. a programming operation 414*w* (to write a logic "1"). In FIG. 4B (and below in relation to FIG. 4D) a scheme based on a ⅓ relationship among voltages is described. It is however understood that a ⅓ relationship is only an example of a possible ratio between voltages provided at different control lines, and other relationships may be possible (e.g., a ½ relationship, or a ⅙ relationship, as other examples).

The write signal set may include a first voltage V1 supplied to the (first) word-line WL(1) corresponding to the memory cell(s) 402*w* intended to be written (e.g., corresponding to one or more first memory cells 402*w* to be written). In some aspects, the first voltage V1 may be supplied to each memory cell 402 of the set of memory cells to which the memory cell(s) 402*w* to be written belong. Illustratively, a set of memory cells may include one or more (first) memory cells 402*w* intended to be written, and one or more (second) memory cells that are not intended to be written. A same (first) voltage may be provided to the memory cells of the set, and the writing of the memory cells that are not intended to be written may be prevented by providing suitable (inhibit) voltages at the corresponding bit-line and source-line. In some aspects, the first voltage V1 may be provided to each memory cell corresponding to the first word-line, e.g. also to memory cells belonging to other sets, whose writing may be prevented by providing suitable (inhibit) voltages at the corresponding bit-line and source-line (see FIG. 5A and FIG. 5C, for example).

The write signal set may include a second voltage V2 supplied to the (second) word-line WL(2) corresponding to the one or more (second) memory cells 402*d* not intended to be written. Illustratively, the second voltage V2 may be supplied to each of the word-lines WL corresponding to sets of memory cells that are not intended to be written.

The write signal set may include a third voltage V3 supplied to the one or more source/bit line pairs corresponding to the memory cell(s) 402*w* intended to be written (e.g., corresponding to the one or more first memory cells). The third voltage V3 may be also provided at each memory cell 402 disposed in a same column as the memory cell(s) 402*w* intended to be written, e.g. also to memory cell(s) 402*d* that are not intended to be written (e.g., memory cell(s) 402*d* of another set of memory cells). The writing of those memory cells 402*d* may be prevented by providing a suitable (second) voltage V2 at the corresponding word-line(s) WL(2).

The write signal set may include a fourth voltage V4 supplied to the one or more source/bit line pairs corresponding to one or more of the (second) memory cells 402*d* not to be written that do not share the respective source/bit line pair with the memory cell(s) 402*w* intended to be written (e.g., with one of the one or more first memory cells). The fourth voltage V4 may be provided at memory cells in a same set as the memory cell(s) 402*w* intended to be written, and at memory cells in other sets of memory cells.

For writing a memory cell 402*w*, a write voltage drop (e.g., an amplitude of the write voltage drop) may correspond to an absolute value of an amplitude of a write voltage $V_W$. The polarity of the voltage drop may define into which memory state the memory cell(s) 402*w* may be written into. The write voltage $V_W$ may be understood as an amplitude to be provided for switching the polarization state (and thus the memory state) of a memory cell 402*w*.

In the configuration shown in FIG. 4A and FIG. 4B, an absolute value of a difference between the first voltage V1 and the third voltage V3 may correspond to the write voltage $V_W$. For writing a "0" (e.g., in case of a n-type memory cell 402*w*), the third voltage V3 may correspond to the write voltage $V_W$, and the first voltage V1 may correspond to the base voltage, $V_B$, as an example. For writing a "1" (e.g., in case of a n-type memory cell 402*w*), the first voltage V1 may correspond to the write voltage $V_W$, and the third voltage V3 may correspond to the base voltage, $V_B$, as an example. Illustratively, at least one of the first voltage V1 or the third voltage V3 may include the base voltage, $V_B$, and the other one of the first voltage V1 or the third voltage V3 may include the write voltage $V_W$. It is understood that other voltages may be provided as first voltage V1 and third voltage V3, as long as a write voltage drop having amplitude equal to or greater than an absolute value of the write voltage $V_W$ is provided.

For preventing the writing of the memory cell(s) 402*d* not intended to be written, the voltages (as part of the write voltage set) supplied to the corresponding control lines may be configured such that a voltage drop at those memory cells is less than the write voltage $V_W$, e.g. such that a voltage drop at those memory cells is about ⅓ of the write voltage $V_W$, as an exemplary ratio.

An absolute value of a difference between the second voltage V2 and the fourth voltage V4 may be in the range from 0 to ⅓ of the write voltage $V_W$. As an example (during the writing of a "0"), the second voltage V2 may include a voltage corresponding to ⅔ of the write voltage $V_W$, and the fourth voltage V4 may include a voltage corresponding to ⅓ of the write voltage $V_W$. As another example (during the writing of a "1"), the second voltage V2 may include a voltage corresponding to ⅓ of the write voltage $V_W$, and the fourth voltage V4 may include a voltage corresponding to ⅔ of the write voltage $V_W$.

Accordingly, an absolute value of a difference between the second voltage V2 and the third voltage V3 may be in the range from 0 to ⅓ of the write voltage $V_W$. As an example (during the writing of a "0"), the second voltage V2 may include a voltage corresponding to ⅔ of the write voltage $V_W$, and the third voltage V3 may include the write voltage $V_W$. As another example (during the writing of a "1"), the second voltage V2 may include a voltage corresponding to ⅓ of the write voltage $V_W$, and the third voltage V3 may include the base voltage $V_B$.

In the configuration shown in FIG. 4A and FIG. 4B, an absolute value of a difference between the first voltage V1 and the second voltage V2 may be ⅔ of the write voltage $V_W$. Such ratio, in combination with the voltages V3, V4 provided at the source/bit-line pairs, may provide that the memory cells 402d not intended to be written, are indeed not written. As an example, in case the first voltage V1 includes the base voltage $V_B$, the second voltage V2 may include a voltage corresponding to ⅔ of the write voltage $V_W$. As another example, in case the first voltage V1 includes the write voltage $V_W$, the second voltage V2 may include a voltage corresponding to ⅓ of the write voltage $V_W$.

Providing voltages according to the scheme above, may ensure that the memory cells 402d not intended to be written experience a voltage drop that does not switch the respective memory state (illustratively, a voltage drop that maintains the respective memory state), however such voltage drop may disturb the memory cells, as described above. Illustratively, an absolute value of an amplitude of the disturb voltage drop may be in the range from 0 to about ⅓ of the write voltage $V_W$ in this scheme, not sufficient to switch the polarization state but enough to affect the memory cells 402d. As another example, the absolute value of an amplitude of the disturb voltage drop may be in the range from 0 to about ½ of the write voltage $V_W$.

In the following, a counter-disturb operation is described, in relation to FIG. 4C and FIG. 4D considering the write operation illustrated above (e.g., with writing of the memory cell 402w in position (1,1)). It is however understood that the aspects described herein may correspondingly apply to other writing operations in which other or additional memory cells have been written.

A counter-disturb signal set (e.g., the counter-disturb signal set 306c) may include one or more counter-disturb voltages VC1, VC2, VC3, VC4 supplied to the control lines of the memory cell arrangement 400 (and thus to the respective control nodes of the memory cells 402). The counter-disturb signal set may include one or more voltages VC1, VC3 supplied to the control lines corresponding to the one or more (first) memory cells written during the write operation (e.g., to the first word-line WL(1), the first source-line SL(1), and the first bit-line BL(1) corresponding to the memory cell 402w in the configuration in FIG. 4C). The write signal set may include one or more voltages VC2, VC4 supplied to the control lines corresponding to the other memory cells 402 of the memory cell arrangement 400, illustratively to one or more (second) memory cells 402 (one or more passive, disturbed, memory cells 402d) not written in the write operation.

The one or more counter-disturb voltages VC1, VC2, VC3, VC4 may be configured (e.g., selected) in accordance with the one or more voltage V1, V2, V3, V4 supplied during the preceding write operation. Illustratively, the one or more counter-disturb voltages VC1, VC2, VC3, VC4 may be configured to provide counter-voltage drops that at least partially compensate the disturb voltage drops caused by the one or more voltage V1, V2, V3, V4 supplied during the preceding write operation.

The counter-disturb voltage drop at the one or more disturbed memory cells 402d may have an opposite polarity with respect to the respective disturb voltage drop at those memory cells 402d. Illustratively, the counter-disturb voltage drop may be configured to compensate the disturb caused by the disturb voltage drop by at least partially polarizing or depolarizing the disturbed memory cell(s) 402d, e.g. by at least partially polarizing or depolarizing the respective spontaneous-polarizable memory layer of the disturbed memory cell(s).

In various aspects, the counter-disturb voltage drop at the one or more disturbed memory cells 402d may have a same amplitude as the respective disturb voltage drop at those memory cells 402d (illustratively, an amplitude having a same absolute value but opposite polarity with respect to the amplitude of the respective disturb voltage drop). As an example, an absolute value of an amplitude of the counter-disturb voltage drop may be in the range from 0 to ½ (half) of the write voltage $V_W$, for example in the range from 0 to ⅓ of the write voltage $V_W$ according to the ⅓ scheme. This may ensure that the disturb may be compensated, without switching the memory state those memory cell(s) 402d is/are residing in. Illustratively, the counter-disturb voltage drop may be configured to change (e.g., increase or reduce) a magnitude of the remanent polarization associated with each of the disturbed memory cells 402 (e.g., of the remanent polarization of the respective spontaneous-polarizable memory layer) without switching the respective memory state (illustratively, without causing an inversion of a sign of the remanent polarization of the spontaneous-polarizable memory layer).

Figure 4D:
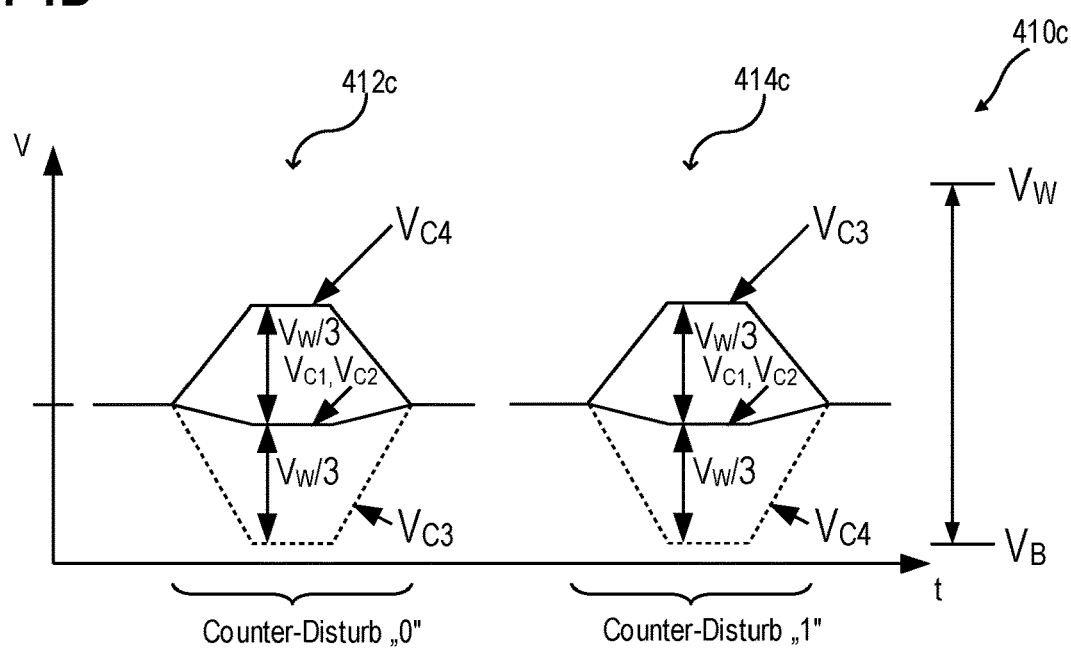
FIG. 4D shows a graph associated with a counter-disturb signal set according to various aspects.

FIG. 4D shows a graph 410c associated with a counter-disturb signal set according to various aspects. The graph 410c illustrates exemplary voltage values for the voltages VC1, VC2, VC3, VC4 supplied to the control lines of the memory cell arrangement 400 for a counter-disturb operation. The graph 410c illustrates exemplary voltage values for compensating the disturb caused by an erasing operation (the counter-disturb "0" 412c) and for compensating the disturb caused by a programming operation (the counter-disturb "1" 414c). In FIG. 4D a scheme based on a ⅓ relationship among voltages during the preceding write operation is described. It is however understood that a ⅓ relationship is only an example, and the counter-disturb voltages may be correspondingly adapted in case of a different relationship (e.g., ½ as another example) among the voltages V1, V2, V3, V4 provided in the write operation.

The counter-disturb signal set may include a first counter-disturb voltage VC1 supplied to the (first) word line WL(1) corresponding to the memory cell(s) 402w written in the write operation (e.g., corresponding to the one or more first memory cells 402w). The first counter-disturb voltage VC1 may be supplied to each memory cell 402 of the set of memory cells to which the memory cell(s) 402w written in the write operation belong. In some aspects, the first counter-disturb voltage VC1 may be provided to each memory cell corresponding to the first word line WL(1).

The counter-disturb signal set may include a second counter-disturb voltage VC2 supplied to the (second) word line WL(2) corresponding to the one or more (second) memory cells 402d not written during the write operation. Illustratively, the second counter-disturb voltage VC2 may be supplied to the word lines WL corresponding to sets of memory cells that were not written in the preceding write operation.

The counter-disturb signal set may include a third counter-disturb voltage VC3 supplied to the one or more source/bit line pairs corresponding to the memory cell(s) 402w written in the write operation (e.g., corresponding to the one or more first memory cells). The third counter-disturb voltage VC3 may be also provided at each memory cell 402 disposed in a same column as the memory cell(s) 402w written in the write operation.

The counter-disturb signal set may include a fourth counter-disturb voltage VC4 supplied to the one or more source/bit line pairs corresponding to one or more of the (second) memory cells 402d not written that do not share the respective source/bit line pair with the memory cell(s) 402w written in the write operation (e.g., with one of the one or more first memory cells). The fourth counter-disturb voltage VC4 may be provided at memory cells in a same set as the memory cell(s) 402w written in the write operation, and at memory cells in other sets of memory cells.

In various aspects, the first counter-disturb voltage VC1 and the second counter-disturb voltage VC2 (e.g., the counter-disturb voltages supplied to the word lines in a counter-disturb operation) may be equal to one another. The first counter-disturb voltage VC1 and the second counter-disturb voltage VC2 may include a voltage corresponding to ⅓ of the write voltage $V_W$. Such voltage value, in combination with the voltages provided at the source lines and bit lines may provide the desired counter-disturb voltage drop at the memory cells (e.g., a ⅓ counter-disturb voltage drop).

To provide the desired counter-disturb voltage drop, a difference between the first counter-disturb voltage VC1 and the third counter-disturb voltage VC3 may be in the range from 0 to ⅓ of the write voltage. Correspondingly, a difference between the second counter-disturb voltage VC2 and the third counter-disturb voltage VC3 may be in the range from 0 to ⅓ of the write voltage. As an example, in case of a counter-disturb following an erasing, the first and second counter-disturb voltages VC1, VC2 may include a voltage corresponding to ⅓ of the write voltage $V_W$, and the third counter-disturb voltage VC3 may include a voltage corresponding to the base voltage $V_B$. As another example, in case of a counter-disturb following a programming, the first and second counter-disturb voltages VC1, VC2 may include a voltage corresponding to ⅓ of the write voltage $V_W$, and the third counter-disturb voltage VC3 may include a voltage corresponding to ⅔ of the write voltage $V_W$.

In a similar fashion, to provide the desired counter-disturb voltage drop, a difference between the first counter-disturb voltage VC1 and the fourth counter-disturb voltage VC4 may be in the range from 0 to ⅓ of the write voltage. Correspondingly, a difference between the second counter-disturb voltage VC2 and the fourth counter-disturb voltage VC4 may be in the range from 0 to ⅓ of the write voltage. As an example, in case of a counter-disturb following an erasing, the first and second counter-disturb voltages VC1, VC2 may include a voltage corresponding to ⅓ of the write voltage $V_W$, and the fourth counter-disturb voltage VC4 may include a voltage corresponding to ⅔ of the write voltage $V_W$. As another example, in case of a counter-disturb following a programming, the first and second counter-disturb voltages VC1, VC2 may include a voltage corresponding to ⅓ of the write voltage $V_W$, and the fourth counter-disturb voltage VC4 may include a voltage corresponding to ⅔ of the write voltage $V_W$.

It is understood that other voltages may be provided as first to fourth counter-disturb voltages VC1, VC2, VC3, VC4, as long as a counter-disturb voltage drop in the range from 0 to ⅓ of the write voltage $V_W$ is provided.

According to the scheme described in relation to FIG. 4B and FIG. 4D the disturb at memory cell(s) that are part of a same set as the memory cell(s) 402w written (or intended to be written) in a write operation may not be compensated. Illustratively, in the configuration in FIG. 4A to FIG. 4D, the memory cell(s) of the first set 406(1) of memory cells may experience both during the write operation and during the counter-disturb operation a same voltage drop (e.g., having same polarity and same amplitude, e.g. ⅓ of the write voltage $V_W$). Illustratively, the disturb of the memory cells part of other sets of memory cells (e.g., the second set 406(2)) may be compensated, while the disturb of the memory cells part of the same set as the written memory cells is not compensated. Those memory cells may however be written during a subsequent write operation (e.g., immediately subsequent), e.g. during writing of a word, so that the disturb effect may be negligible.

In addition, according to the scheme described in relation to FIG. 4B and FIG. 4D the memory cell(s) 402w written in the write operation experience a voltage drop during the counter-disturb operation intended for the other memory cells 402d. Illustratively, the counter-disturb voltages VC1, VC2, VC3, VC4 may provide an "intentional disturb" voltage drop at the memory cell(s) 402w written in the write operation (e.g., a voltage drop having opposite polarity and less magnitude with respect to the write voltage drop). In various aspects, such "intentional disturb" voltage drop may at least partially depolarize the spontaneous-polarizable memory layer of the written memory cell(s) 402w, e.g. by switching the polarization state of the weakly polarized grains. In various aspects, this may provide that the memory state of the written memory cell(s) 402w is defined only by stable grains, thus increasing the reliability of the data retention.

FIG. 5A, FIG. 5B, FIG. 5C, and FIG. 5D illustrate consecutive write operations (FIG. 5A and FIG. 5C) with the corresponding counter-disturb operations (FIG. 5B and FIG. 5D) in a memory cell arrangement 500 according to various aspects. The memory cell arrangement 500 may be an exemplary configuration of the memory cell arrangement 300 described in FIG. 3, e.g. including a plurality of (spontaneous-polarizable) memory cells 502 (e.g., each including a field-effect transistor structure coupled to a capacitive memory structure) disposed in a matrix arrangement with corresponding word-lines WL, bit-lines BL, and source-lines SL. Each memory cell 502 may include a corresponding gate node 504w, source node 504s, and drain node 504d. The memory cells 502 may be an exemplary configuration of the memory cells 302, 402 described in relation to FIG. 3 to FIG. 4D.

In the configuration in FIG. 5A to FIG. 5D, the memory cell arrangement 500 may include a plurality of sets 506 of memory cells 502, e.g. four sets 506(1), 506(2), 506(3), 506(4), each including one or more memory cells 502. The first set 506(1) and the third set 506(3) may be corresponding to the first word-line WL(1), and the second set 506(2) and the fourth set 506(4) may be corresponding to the second word-line WL(2). The memory cells 502 of the first set 506(1) and the second set 506(2) may share the same bit-lines BL(1), BL(2) and source-lines SL(1), SL(2). The memory cells 502 of the third set 506(3) and the fourth set 506(4) may share the same bit-lines BL(3), BL(4) and source-lines SL(3), SL(4).

Figure 5A:
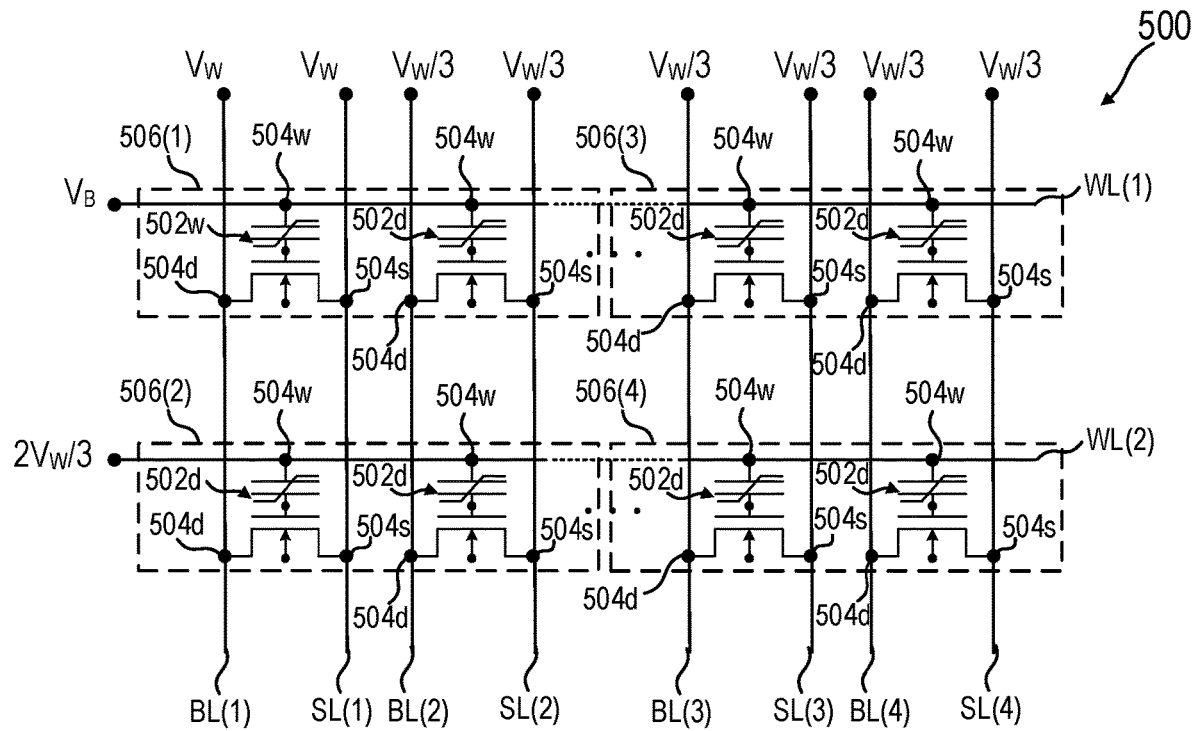
FIG. 5A, FIG. 5B, FIG. 5C, and FIG. 5D each shows a memory cell arrangement in a schematic view according to various aspects.
Figure 5B:
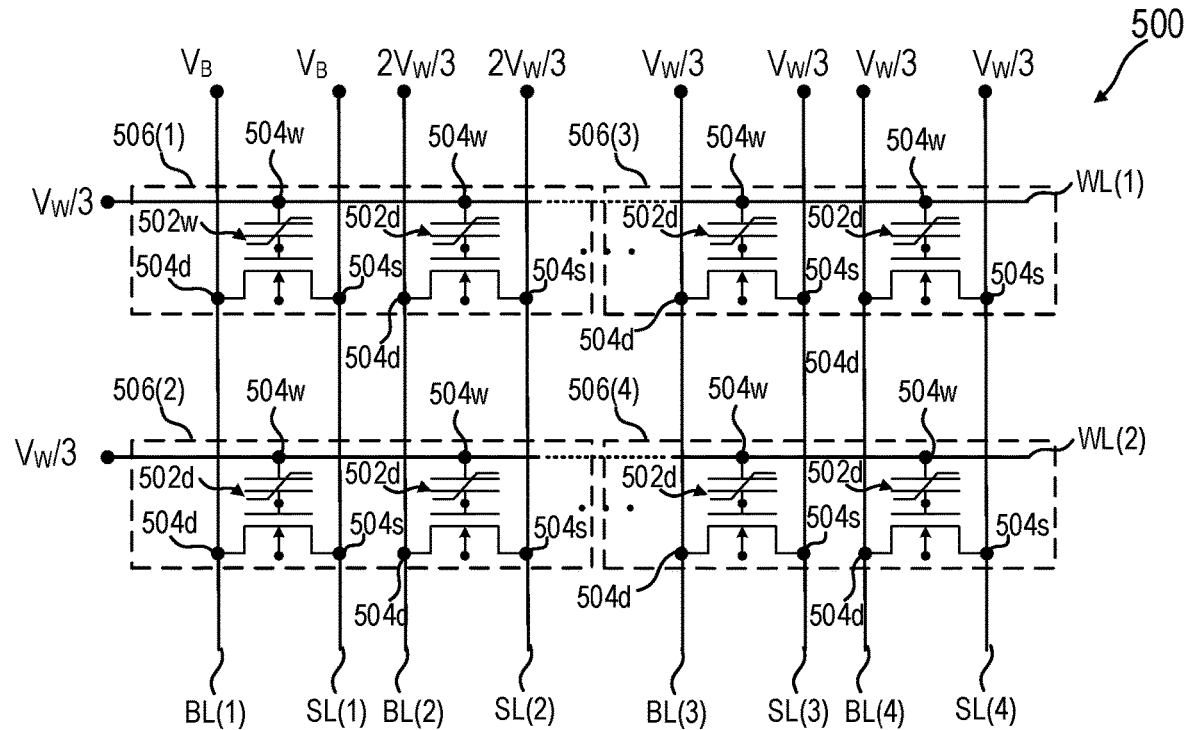
Figure 5C:
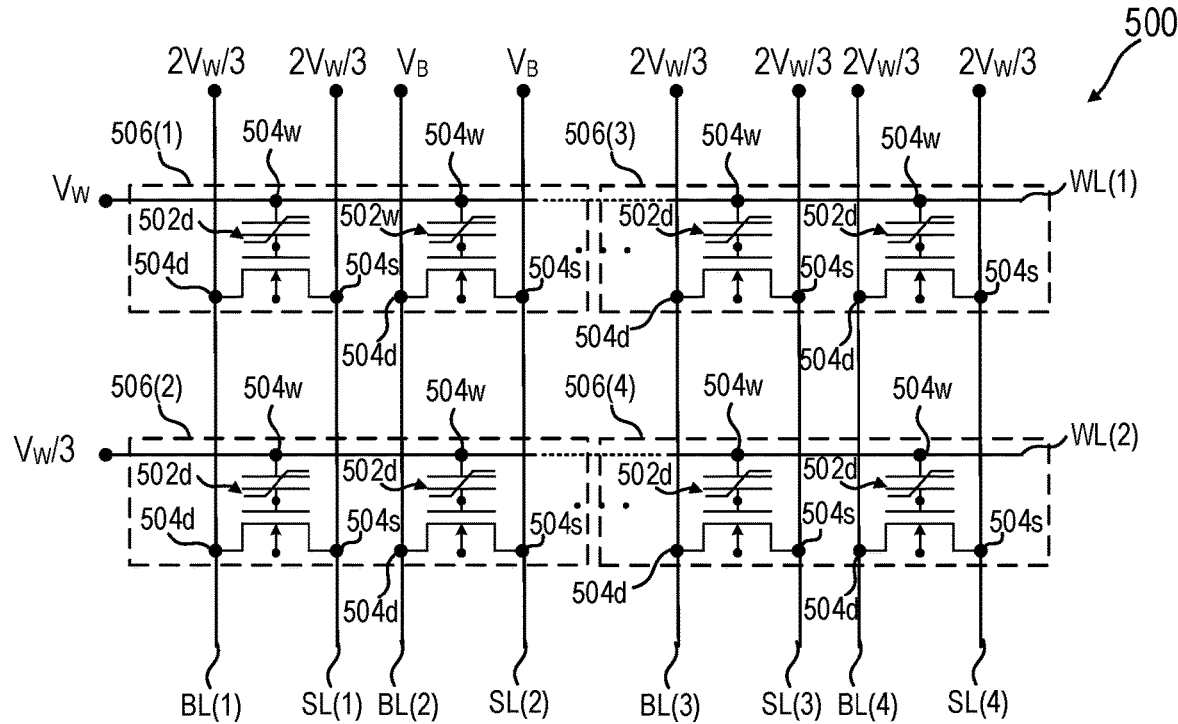

In FIG. 5A and FIG. 5C it is illustrated the writing of a memory cell 502w of the first set 506(1), and the corresponding disturb of the of the other memory cells 502d of the memory cell arrangement 500.

In FIG. 5A the writing of a logic "0" in the memory cell 502w in position (1,1) in the memory cell arrangement 500 is shown. The writing may include providing corresponding voltages (as part of a write signal set) to the control lines of the memory cell arrangement 500, as described above in relation to FIG. 4B. As an example, the base voltage $V_B$ may be provided at the first word-line WL(1), the write voltage $V_W$ may be provided at the first bit-line BL(1) and the first source-line SL(1), a voltage corresponding to ⅓ of the write voltage $V_W$ may be provided at the other bit-lines BL(2), BL(3), BL(4) and source-lines SL(2), SL(3), SL(4), and a voltage corresponding to ⅔ of the write voltage $V_W$ may be provided at the other word-lines WL(2). The writing in FIG. 5A may correspond to writing a "0" in the first word of the memory cell arrangement 500.

In the writing shown in FIG. 5A, a write voltage drop $(-V_W)$ may be provided at the memory cell 502w to be written, and disturb voltage drops may be provided at the other memory cells (having either positive polarity or negative polarity depending on the voltages provided at the corresponding control lines). For example, a disturb voltage drop with positive polarity $(+V_D)$ may be provided at the memory cells positions (2,2), (2,3) and (2,4) in the memory cell arrangement 500, and a disturb voltage drop with negative polarity $(-V_D)$ may be provided at the memory cells in positions (1,2), (1,3), (1,4), and (2,1) in the memory cell arrangement 500.

FIG. 5B illustrates the counter-disturb operation corresponding to the write operation of FIG. 5A. The counter-disturb may include providing corresponding counter-disturb voltages (as part of a counter-disturb signal set) to the control lines of the memory cell arrangement 500, as described above in relation to FIG. 4D. As an example, a voltage corresponding to ⅓ of the write voltage $V_W$ may be provided at the word-lines WL(1), WL(2), the base voltage $V_B$ may be provided at the first bit-line BL(1) and the first source-line SL(1), a voltage corresponding to ⅔ of the write voltage $V_W$ may be provided at the other bit-line BL(2) and source-line SL(2) corresponding to the set 506(1) including the written memory cell 502w, and a voltage corresponding to ⅓ of the write voltage $V_W$ may be provided at the other bit-lines BL(3), BL(4) and source-lines SL(3), SL(4).

In the counter-disturb shown in FIG. 5B, the memory cells of the sets 506(3), 506(4) of memory cells that do not share bit-lines and source-lines with the set 506(1) including the written memory cell 502w do not experience a voltage drop (e.g., the resulting voltage drop is 0 V). The disturb at these memory cells of the sets 506(3), 506(4) is thus not compensated in the counter-disturb operation, but it is "automatically" compensated during a subsequent write operation, as discussed in further detail below.

In the counter-disturb shown in FIG. 5B, the memory cells of the set 506(2) of memory cells sharing bit-lines and source-lines with the set 506(1) including the written memory cell 502w experience a counter-disturb voltage drop, e.g. having positive polarity for the cell in position (2,1) and negative polarity for the cell in position (2,2). The memory cell(s) of the set 506(1) including the written memory cell 502w (both the written memory cell as well as the other memory cells of the set) experience a (further) disturb voltage drop, e.g. having positive polarity for the cell in position (1,1) and negative polarity for the cell in position (1,2), as discussed above.

Figure 5D:
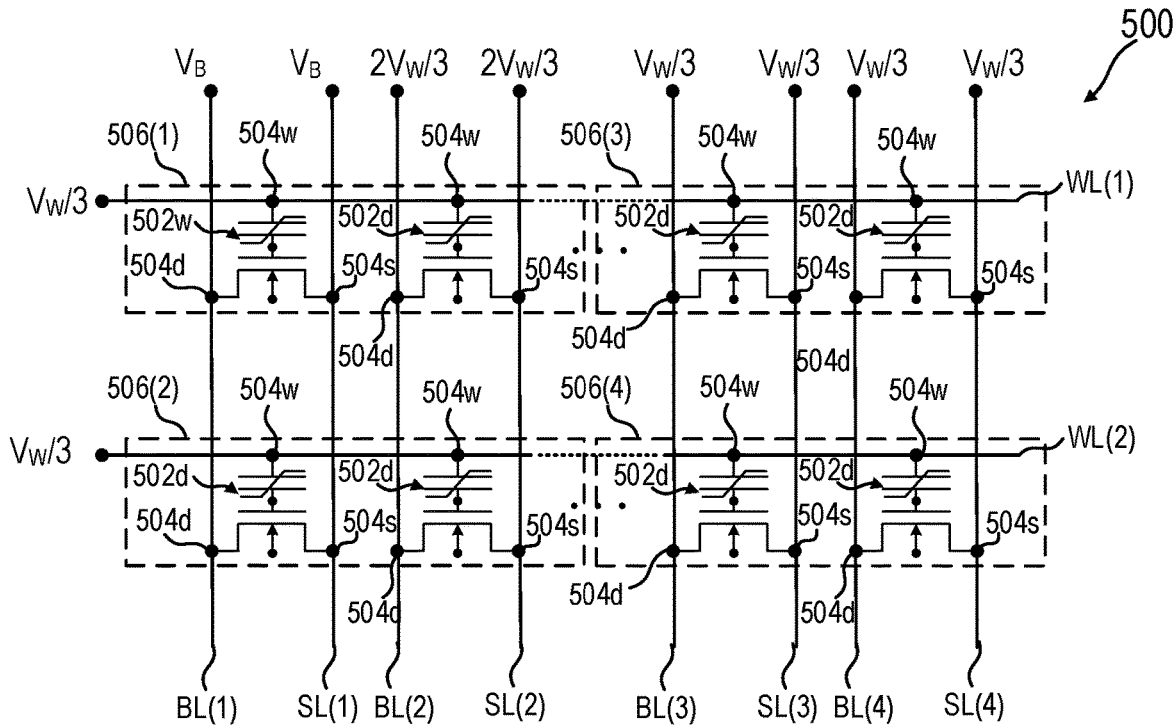

In FIG. 5C and FIG. 5D it is illustrated the writing of another memory cell 502w of the first set 506(1), and the corresponding disturb of the of the other memory cells 502d of the memory cell arrangement 500.

In FIG. 5C the writing of a logic "1" in the memory cell 502w in position (1,2) in the memory cell arrangement 500 is shown (e.g., after having written a "0" in the memory cell in position (1,1) as described in FIG. 5A). The writing may include providing corresponding voltages to the control lines of the memory cell arrangement 500, as described above in relation to FIG. 4B. As an example, the write voltage $V_W$ may be provided at the first word-line WL(1), the base voltage $V_B$ may be provided at the second bit-line BL(2) and the second source-line SL(2), a voltage corresponding to ⅓ of the write voltage $V_W$ may be provided at the other word line(s) WL(2), and a voltage corresponding to ⅔ of the write voltage $V_W$ may be provided at the other bit-lines BL(1), BL(3), BL(4) and source-lines SL(1), SL(3), SL(4). The writing in FIG. 5A and FIG. 5C may correspond to writing a "01" in the first word of the memory cell arrangement.

In the writing shown in FIG. 5C, a write voltage drop $(+V_W)$ may be provided at the memory cell 502w to be written, and disturb voltage drops may be provided at the other memory cells 502d. For example, a disturb voltage drop with positive polarity $(+V_D)$ may be provided at the memory cells positions (1,1), (1,3), (1,4), (2,2) which may counteract the disturb at the memory cells of the third set 506(3) during the writing shown in FIG. 5A. A disturb voltage drop with negative polarity $(-V_D)$ may be provided at the memory cells in positions (2,1), (2,3), (2,4), which may counteract the disturb at the memory cells of the fourth set 506(4) during the writing shown in FIG. 5A. Illustratively, the disturb at the memory cells of the sets 506(3), 506(4) of memory cells that do not share bit-lines and source-lines with the set 506(1) including the written memory cell 502w may be automatically compensated by writing a "0" and a "1" (or a "1" and then a "0"), so that further measures for those memory cells may be dispensed with.

FIG. 5D illustrates the counter-disturb operation corresponding to the write operation of FIG. 5C. The counter-disturb may include providing corresponding counter-disturb voltages to the control lines of the memory cell arrangement 500, as described above in relation to FIG. 4D. As an example, a voltage corresponding to ⅓ of the write voltage $V_W$ may be provided at the word-lines WL(1), WL(2), a voltage corresponding to ⅔ of the write voltage $V_W$ may be provided at the bit-line BL(2) and source-line SL(2), the base voltage $V_B$ may be provided at the first bit-line BL(1) and the first source-line SL(1) corresponding to the set 506(1) including the written memory cell 502w, and a voltage corresponding to ⅓ of the write voltage $V_W$ may be provided at the other bit-lines BL(3), BL(4) and source-lines SL(3), SL(4). As described in relation to FIG. 5B, also in the counter-disturb shown in FIG. 5D, the memory cells of the sets 506(3), 506(4) do not experience a voltage drop, as the disturb is inherently compensated.

In the counter-disturb shown in FIG. 5D, the memory cells of the set 506(2) of memory cells sharing bit-lines and source-lines with the set 506(1) including the written memory cell 502w experience a counter-disturb voltage drop, e.g. having positive polarity for the cell in position (2,1) and negative polarity for the cell in position (2,2). The memory cell(s) of the set 506(1) including the written memory cell 502w (both the written memory cell as well as the other memory cells of the set) experience a (further) disturb voltage drop, e.g. having positive polarity for the cell in position (1,1) and negative polarity for the cell in position (1,2), as discussed above.

Figure 6A:
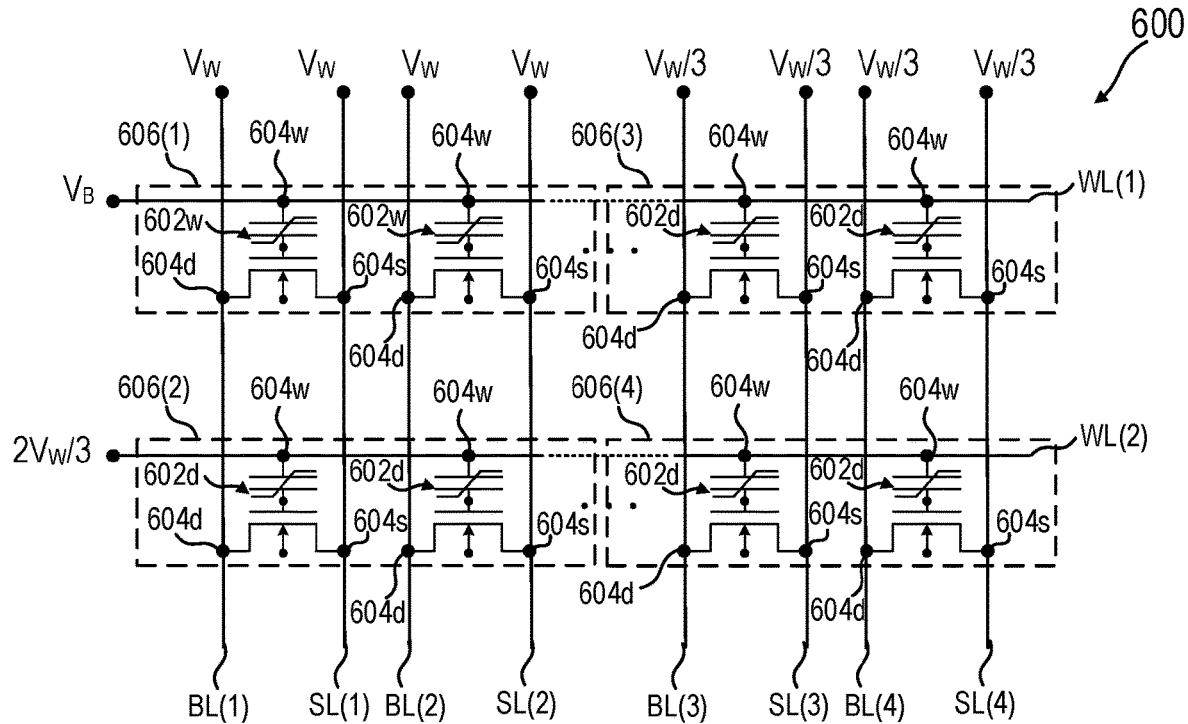
FIG. 6A, FIG. 6B, FIG. 6C, and FIG. 6D each shows a memory cell arrangement in a schematic view according to various aspects.
Figure 6B:
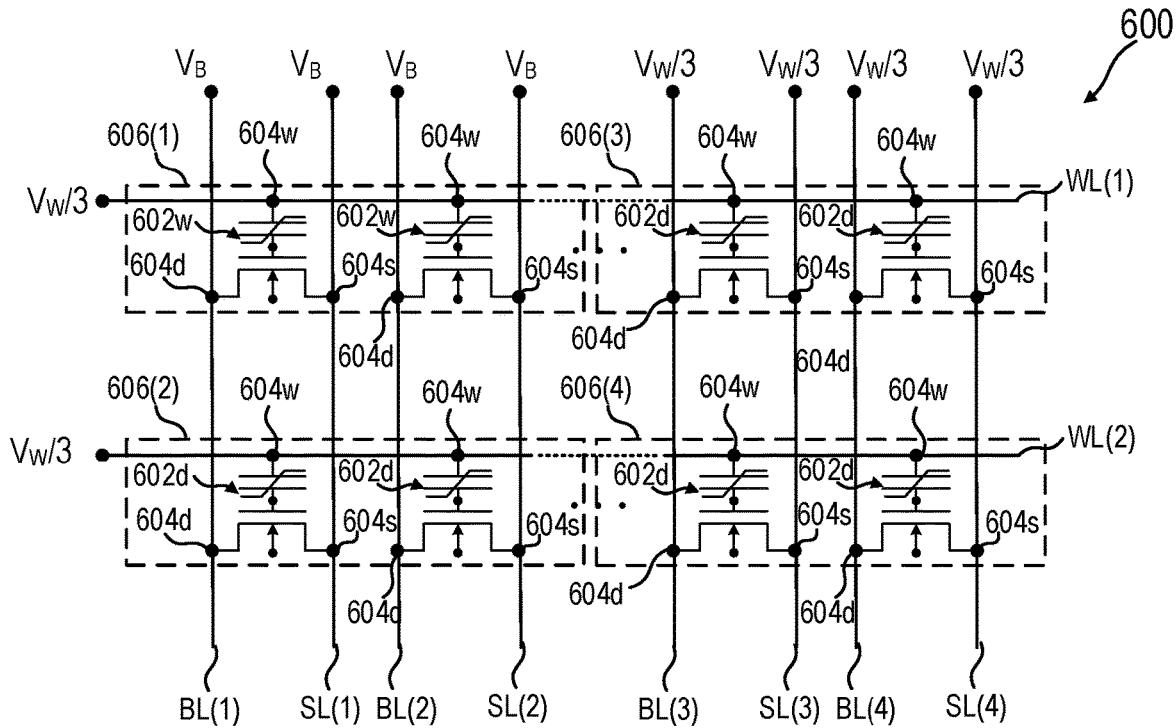
Figure 6C:
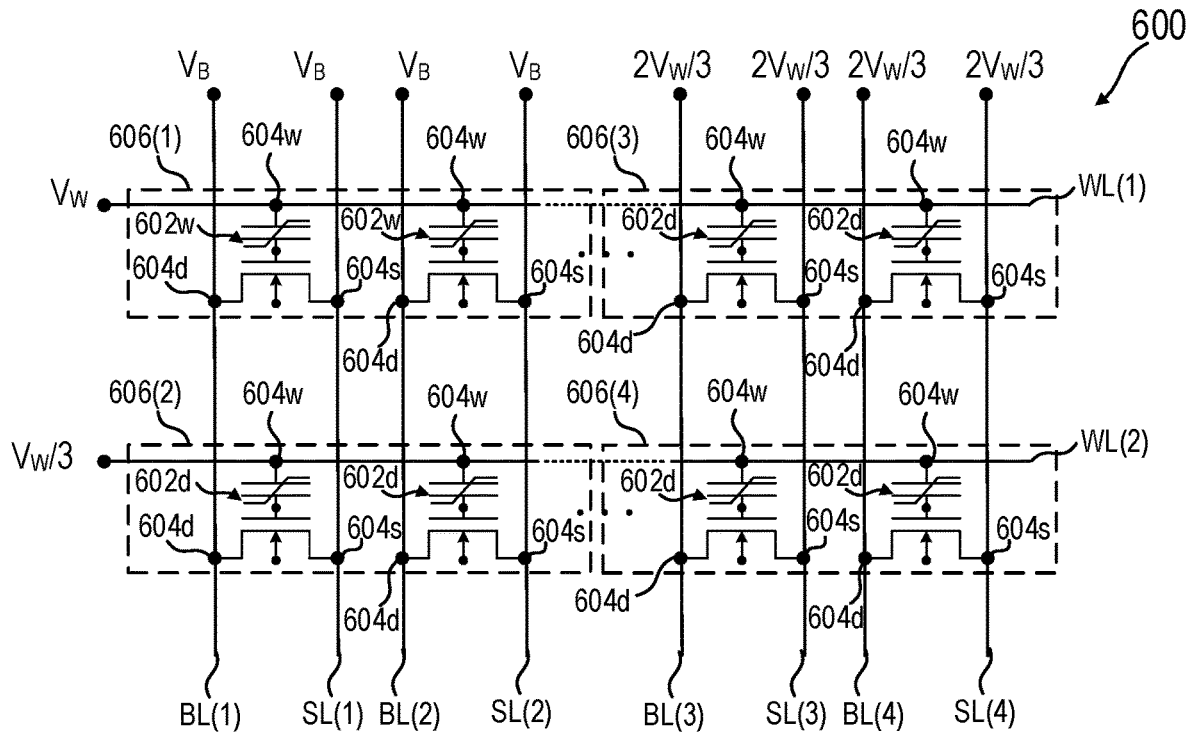
Figure 6D:
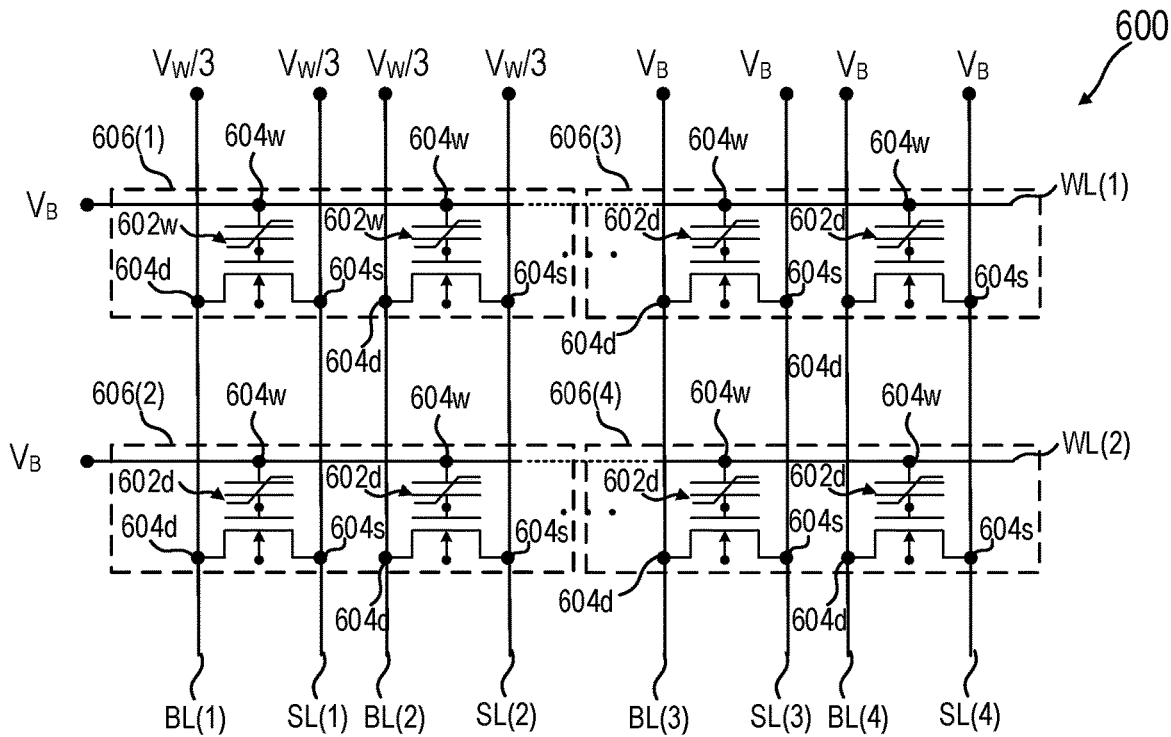

FIG. 6A and FIG. 6B illustrate a writing operation and the corresponding counter-disturb operation for writing more than one memory cell of a same set into a memory state (e.g., in the HVT state). FIG. 6C and FIG. 6D, illustrate a writing operation and the corresponding counter-disturb operation for writing more than one memory cell of a same set into a memory state (e.g., in the LVT state).

The writing operation and the counter-disturb operation are illustrated in FIG. 6A to FIG. 6D in relation to a memory cell arrangement 600. The memory cell arrangement 600 may be configured as the memory cell arrangement 500 described in relation to FIG. 5A to FIG. 5D, and may include a plurality of (spontaneous-polarizable) memory cells 602 (e.g., each including a field-effect transistor structure coupled to a capacitive memory structure) disposed in a matrix arrangement with corresponding word-lines WL, bit-lines BL, and source-lines SL. Each memory cell 602 may include a corresponding gate node 604w, source node 604s, and drain node 604d. The memory cell arrangement 600 may include a plurality of sets 606 of memory cells 602, e.g. four sets 606(1), 606(2), 606(3), 606(4), each including one or more memory cells 602.

In FIG. 6A and FIG. 6C it is illustrated the writing of a plurality of memory cells 602w of the first set 606(1), and the corresponding disturb of the of the other memory cells 602d of the memory cell arrangement 600. In FIG. 6A and FIG. 6C it is illustrated the writing of two memory cells 602w, it is however understood that the aspects described herein may apply to the writing of more than two (e.g., each) memory cells 602 of a set 606.

In FIG. 6A the writing of a logic "0" in the memory cells 602w of the first set 606 (in positions (1,1) and (1,2) in the arrangement 600 is shown. The writing may include providing corresponding voltages (as part of a write signal set) to the control lines of the memory cell arrangement 600, as described above in relation to FIG. 4B. As an example, the base voltage $V_B$ may be provided at the first word-line WL(1), the write voltage $V_W$ may be provided at the bit-lines BL(1), BL(2) and source-lines SL(1), SL(2) corresponding to the first set 606, a voltage corresponding to ⅓ of the write voltage $V_W$ may be provided at the other bit-lines BL(3), BL(4) and source-lines SL(3), SL(4) of the memory cell arrangement 600, and voltage corresponding to ⅔ of the write voltage $V_W$ may be provided at the other word-lines WL(2) of the memory cell arrangement 600. The writing in FIG. 6A may correspond to writing a "00 . . . " in the first word of the memory cell arrangement 600.

In the writing shown in FIG. 6A, a write voltage drop ($-V_W$) may be provided at the memory cells 602w to be written, and disturb voltage drops may be provided at the other memory cells. For example, a disturb voltage drop with positive polarity ($+V_D$) may be provided at the memory cells in positions (2,3) and (2,4) in the memory cell arrangement 600, and a disturb voltage drop with negative polarity ($-V_D$) may be provided at the memory cells in positions (1,3), (1,4), (2,1), and (2,2).

FIG. 6B illustrates the counter-disturb operation corresponding to the write operation of FIG. 6A. The counter-disturb may include providing corresponding counter-disturb voltages (as part of a counter-disturb signal set) to the control lines of the memory cell arrangement 600, as described above in relation to FIG. 4D. As an example, a voltage corresponding to ⅓ of the write voltage $V_W$ may be provided at the word-lines WL(1), WL(2), the base voltage $V_B$ may be provided at the bit-lines BL(1), BL(2) and source-lines SL(1), SL(2) corresponding to the first set 606, and a voltage corresponding to ⅓ of the write voltage $V_W$ may be provided at the other bit-lines BL(3), BL(4) and source-lines SL(3), SL(4).

In the counter-disturb shown in FIG. 6B, the memory cells of the sets 606(3), 606(4) of memory cells that do not share bit-lines and source-lines with the first set 606(1) do not experience a voltage drop (e.g., the resulting voltage drop is 0 V). The disturb at these memory cells of the sets 606(3), 606(4) may be "automatically" compensated during a subsequent write operation, as described above and as discussed in further detail below. The memory cells of the second set 606(2) of memory cells sharing bit-lines and source-lines with the first set 606(1) experience a counter-disturb voltage drop, e.g. having positive polarity. The written memory cell(s) 602w of the first set 606(1) experience a (intentional) disturb voltage drop, e.g. having positive polarity.

In FIG. 6C the writing of a logic "1" in the memory cells 602w of the first set 606 (in positions (1,1) and (1,2) in the arrangement 600 is shown. As an example, the base voltage $V_B$ may be provided at the bit-lines BL(1), BL(2) and source-lines SL(1), SL(2) corresponding to the first set 606, the write voltage $V_W$ may be provided at the first word-line WL(1), a voltage corresponding to ⅓ of the write voltage $V_W$ may be provided at the other word-lines WL(2), and a voltage corresponding to ⅔ of the write voltage $V_W$ may be provided at the other bit-lines BL(3), BL(4) and source-lines SL(3), SL(4) of the memory cell arrangement 600. The writing in FIG. 6A may correspond to writing a "11 . . . " in the first word of the memory cell arrangement 600.

In the writing shown in FIG. 6C, a write voltage drop ($V_W$) may be provided at the memory cells 602w to be written, and disturb voltage drops may be provided at the other memory cells. For example, a disturb voltage drop with positive polarity ($+V_D$) may be provided at the memory cells in positions (1,3) and (1,4) in the memory cell arrangement 600, and a disturb voltage drop with negative polarity ($-V_D$) may be provided at the memory cells in positions (2,3), and (2,4), which would compensate the disturb experienced by those memory cells during writing of "00 . . . " shown in FIG. 6A. A disturb voltage drop with positive polarity ($+V_D$) may also be provided at the memory cells in positions (2,1) and (2,2) in the memory cell arrangement 600.

FIG. 6D illustrates the counter-disturb operation corresponding to the write operation of FIG. 6C. The counter-disturb may include providing corresponding counter-disturb voltages to the control lines of the memory cell arrangement 600. As an example, the base voltage $V_B$ may be provided at the word-lines WL(1), WL(2), a voltage corresponding to ⅓ of the write voltage $V_W$ may be provided at the bit-lines BL(1), BL(2) and source-lines SL(1), SL(2) corresponding to the first set 606, and the base voltage $V_B$ may be provided at the other bit-lines BL(3), BL(4) and source-lines SL(3), SL(4).

In the counter-disturb shown in FIG. 6D, the memory cells of the sets 606(3), 606(4) of memory cells that do not share bit-lines and source-lines with the first set 606(1) do not experience a voltage drop, as discussed above (and the respective disturb may be compensated upon writing a "0" in the first set 606(1)). The memory cells of the second set 606(2) experience a counter-disturb voltage drop, e.g. negative positive polarity. The written memory cell(s) 602w of the first set 606(1) experience a (intentional) disturb voltage drop, e.g. having negative polarity.

In various aspects, as an alternative or additional approach to prevent or reduce the disturb effects on the memory cells of a memory cell arrangement (e.g., on the memory cells 302 of the memory cell arrangement 300) that are not intended to be written, dedicated access transistors may be provided. Illustratively, each word-line of a memory cell arrangement may have a corresponding access transistor configured to allow or prevent a current flow in the respective word-line (e.g., a first word-line has a corresponding first access transistor, a second word-line has a second access transistor, etc.). Viewed from a different angle, an access transistor may be configured to allow or prevent a voltage to be provided at the respective word-line. An access transistor may be controlled (e.g., via a respective control signal provided by the control circuit of the memory cell arrangement, e.g. by the control circuit 304) to allow or prevent a voltage to be provided at the gate node of a memory cell (e.g., at the gate nodes of the memory cells of a set of memory cells). An access transistor may be configured, in a first state (an ON state), to allow a current flow in the respective word-line, and in a second state (an OFF state), to prevent the current flow in the respective word-line.

In various aspects, a memory cell arrangement may include a corresponding access transistor for each set of memory cells. Illustratively, each access transistor may be corresponding to a portion of a word-line (rather than to the entire word-line, e.g. to the portion corresponding to the respective set) to allow or prevent a current flow in the respective portion. Further illustratively, a word-line WL may be understood as a global word-line, divided into one or more local word-lines (one for each set of memory cells corresponding to that global word-line), and each local word-line may have a corresponding access transistor. The portion of a (global) word-line may be understood as a local word-line. The access transistors corresponding to the local word-lines of a same global word-line may be connected in parallel with one another (see FIG. 7A and FIG. 7B). The portion of a word-line may include the connection to the respective control nodes (e.g., gate nodes) of the memory cells of a respective set of memory cells. An access transistor, in this configuration, may be configured (e.g., controlled) to allow or prevent an addressing (e.g., a writing, or a counter-disturb) of the memory cells of the respective set of memory cells. This may provide preventing a disturb from occurring to memory cells of the sets that are not written during a write operation, illustratively by "disconnecting" such sets from the set that is being written.

Figure 7A:
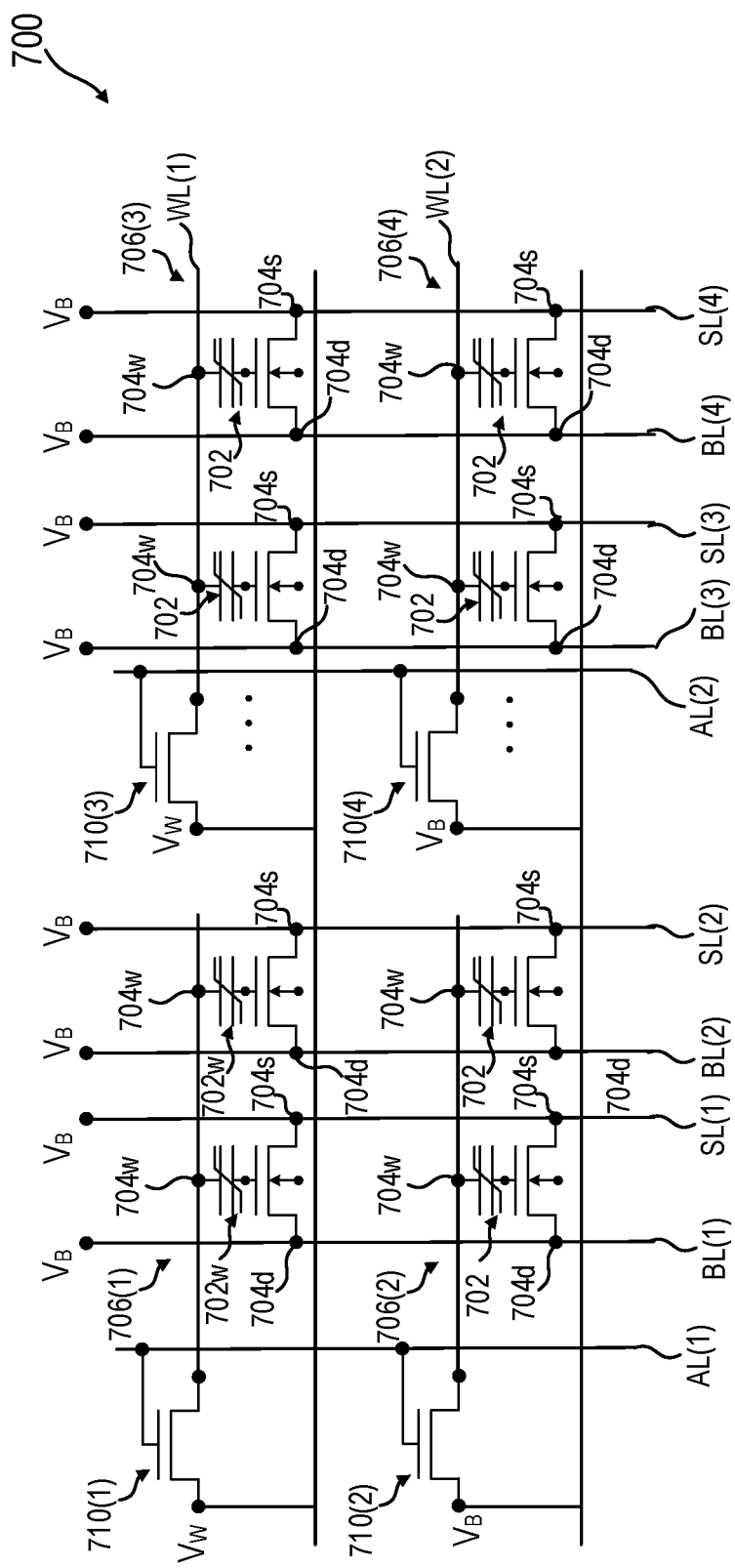
FIG. 7A and FIG. 7B each shows a memory cell arrangement in a schematic view according to various aspects.
Figure 7B:
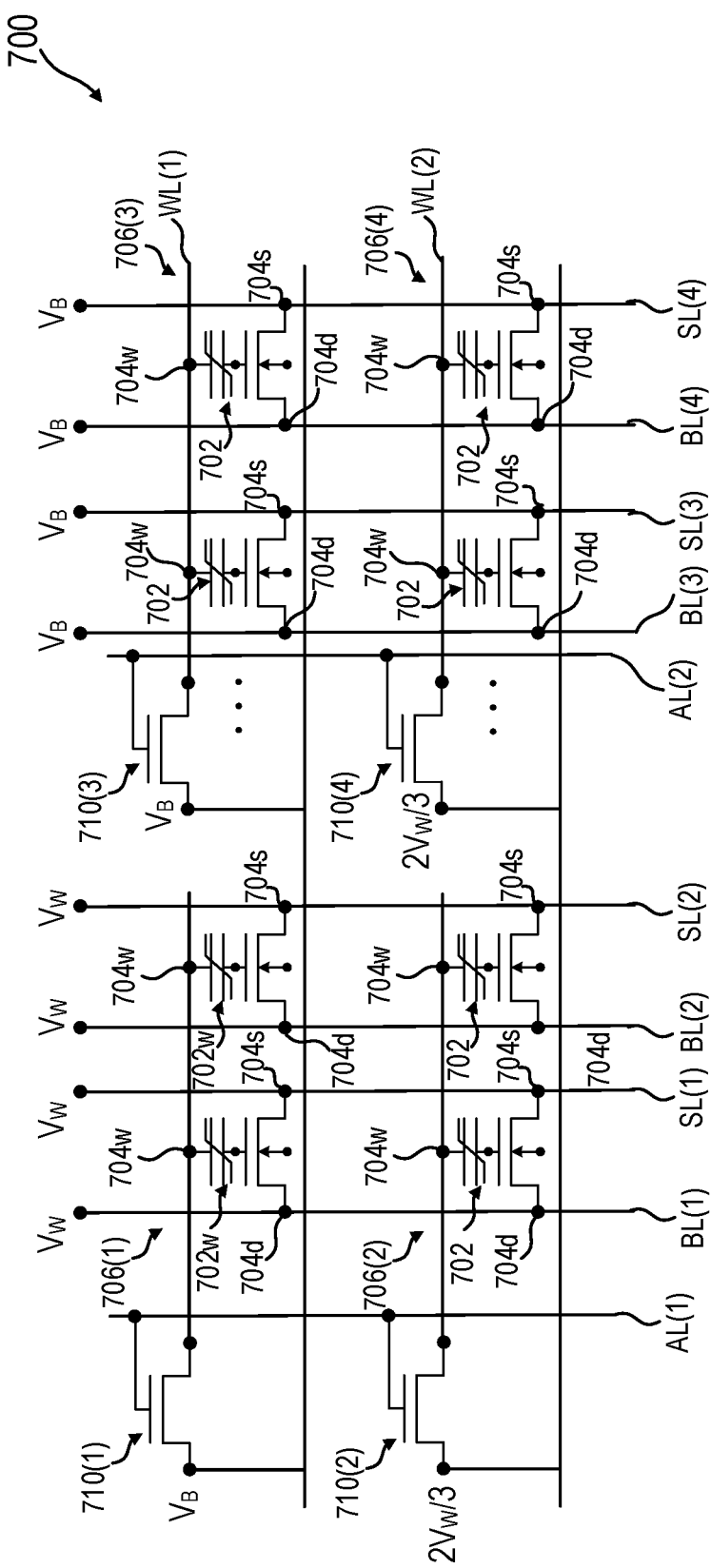

FIG. 7A and FIG. 7B illustrate a respective write operation in a memory cell arrangement 700 including a plurality of access transistors 710 in a schematic view according to various aspects. The memory cell arrangement 700 may be an exemplary configuration of the memory cell arrangement 300 described in relation to FIG. 3. In the configuration in FIG. 7A and FIG. 7B, the memory cell arrangement may include a plurality of (spontaneous-polarizable) memory cells 702 including a field-effect transistor structure coupled to a capacitive memory structure. It is however understood that a configuration including access transistors may be provided also for a memory cell arrangement including other types of memory cells (e.g., based only on a capacitive memory structure, as described in FIG. 1). The plurality of memory cells 702 may be an exemplary configuration of the memory cells 302 of the memory cell arrangement 300.

The memory cells 702 may be disposed in a matrix arrangement with corresponding word-lines WL, bit-lines BL, and source-lines SL. Each memory cell 702 may include a corresponding gate node 704w, source node 704s, and drain node 704d. The memory cell arrangement 700 may include a plurality of sets 706 of memory cells 702, e.g. four sets 706(1), 706(2), 706(3), 706(4), each including one or more memory cells 702.

The memory cell arrangement 700 may include a plurality of access transistors 710, e.g. each corresponding to a respective set 706 of memory cells 702 (e.g., four access transistors 710(1), 710(2), 710(3), 710(4) in the configuration in FIG. 7A and FIG. 7B), e.g. each corresponding to a respective local word-line of the global word-lines WL(1), WL(2) of the memory cell arrangement 700. The memory cell arrangement 700 may include one or more additional control lines (referred to herein as access lines AL) corresponding to the plurality of access transistors 710. The access transistors 710 corresponding to sets of memory cells 702 sharing same source/bit-line pairs may be corresponding (e.g., may be connected to) a same access line AL. In the configuration in FIG. 7A and FIG. 7B the (first and second) access transistors 710(1), 710(2) corresponding to the first set 706(1) and second set 706(2) of memory cells 702 may be corresponding to a first access line AL(1), and the (third and fourth) access transistors 710(3), 710(4) corresponding to the third set 706(3) and fourth set 706(4) of memory cells 702 may be corresponding to a second access line AL(2). Illustratively, an access line AL may be provided to deliver a control signal to the access transistors 710 connected thereto, e.g. at a respective gate node of the access transistors 710. As shown in FIG. 7A and FIG. 7B, the access transistors 710 corresponding to a same global word-line WL(1), WL(2) may be connected in parallel with one another (e.g., at the respective source node), e.g. the first access transistor 710(1) and the third access transistor 710(3) corresponding to the first word-line WL(1) may be connected in parallel with one another, and the second access transistor 710(2) and the fourth access transistor 710(4) corresponding to the second word-line WL(2) may be connected in parallel with one another. The connection in parallel may provide addressing a desired set of memory cells corresponding to a certain global word-line, while being able to "disconnect" the other sets of memory cells corresponding to that word-line.

In various aspects, each access transistor 710 may include a field-effect transistor structure, e.g. with a source node, a drain node, and a gate node to control an electrical behavior of the source node and drain node (in a similar manner as described for the field-effect transistor structure in FIG. 2). A control signal provided at the gate node may allow or prevent a current flow between the source node and drain node, thus illustratively "connecting" or "disconnecting" the corresponding set of memory cells from the associated word-line or word-line portion. Illustratively, a (first) control signal may be configured to short circuit the source node and the drain node of an access transistor with one another, in such a way that a voltage provided at the source node may be transferred at the drain node (illustratively, such that a voltage provided at the global word-line may be transferred at the local word-line). A (second) control signal may be configured to open the connection of the source node and the drain node of an access transistor with one another, in such a way that a voltage provided at the source node is not transferred at the drain node (illustratively, isolating a local word-line and the corresponding set of memory cells).

FIG. 7A and FIG. 7B illustrate a writing of the memory cells 702w of the first set 706(1) of memory cells. In this scenario, a (first) control signal may be provided at the (first) access line AL(1) corresponding to the (first) access transistor 710(1) associated with the (first) set 706(1) including the memory cell(s) 702w to be written. The first control signal may be configured to turn on the access transistor(s) coupled to the first access line AL(1), e.g. to enable a current flow in the corresponding word-line or word-line portion. Illustratively, a gate-source voltage drop at the first and second access transistors 710(1), 710(2) provided by the first control signal and the voltage at the respective source node of the first and second access transistors 710(1), 710(2) may allow a voltage to be provided at the local word-line corresponding to the first set 706(1) of memory cells, and inherently a voltage to be provided at the local word-line corresponding to the second set 706(2) of memory cells. In the other case, e.g., if an access transistor remains closed (off) the corresponding local word-line may remain electrically floating, e.g., at a voltage that is substantially the base voltage.

A (second) control signal may be provided at the (second) access line AL(2) corresponding to the access transistor(s) 710(3), 710(4) associated with the one or more other sets 706(3), 706(4) not including memory cells to be written during the write operation. The second control signal may be configured to turn off the access transistor(s) coupled to the second access line AL(2), e.g. to prevent a current flow in the corresponding word-line or word-line portion. Illustratively, a gate-source voltage drop at the third and fourth access transistors 710(3), 710(4) provided by the second control signal and the voltage at the respective source nodes of the third and fourth access transistors 710(3), 710(4) may prevent a voltage to be provided at the local word-line corresponding to the third and fourth sets 706(3), 706(4) of memory cells.

As an exemplary scheme for writing a "1" in the memory cells 702w of the first set 706(1), shown in FIG. 7A, the base voltage $V_B$ may be provided at each bit-line BL and source-line SL of the memory cell arrangement 700. The write voltage $V_W$ may be provided at the source nodes of the access transistors 710(1), 710(3) corresponding to the first word-line WL(1), and the first control signal at the first access transistor 710(1) may allow the write voltage $V_W$ to be provided at the word-line portion corresponding to the first set 710(1) of memory cells 702, while the second control signal at the third access transistor 710(3) may prevent the write voltage $V_W$ to be provided at the word-line portion corresponding to the third set 710(3) of memory cells 702. The base voltage $V_B$ may be provided at the source nodes of the access transistors 710(2), 710(4) corresponding to the second word-line WL(2), and the first control signal (and gate-source voltage drop) at the second access transistor 710(2) may allow the base voltage $V_B$ to be provided at the word-line portion corresponding to the second set 710(2) of memory cells 702, while the second control signal at the fourth access transistor 710(3) may prevent the base voltage $V_B$ to be provided at the word-line portion corresponding to the fourth set 710(4) of memory cells. The writing in FIG. 7A may provide writing "11 . . . " in the first word of the memory cell arrangement 700.

With the scheme described in FIG. 7A, the memory cells 702w to be written experience a write voltage drop (with amplitude +$V_W$), e.g. having positive polarity. The other memory cells 702 not intended to be written do not experience any voltage drop (e.g., 0 V), so that a disturb at those memory cells may be prevented. Illustratively, the base voltage $V_B$ is provided at the nodes of the memory cells 702 of the second set 706(2) so that these memory cells do not experience any voltage drop, and the access transistors 710(3), 710(4) may provide dispensing with the use of inhibit voltages during writing, such that the disturb of other memory cells may be reduced or prevented. The access transistors 710 may "disconnect" (in other words, decouple) the memory cells not intended to be written from the memory cells intended to be written, such that a disturb voltage drop may be prevented.

An exemplary scheme for writing a "0" in the memory cells 702w of the first set 706(1) is shown in FIG. 7B. The base voltage $V_B$ may be provided at the source nodes of the of the access transistors 710(1), 710(3) corresponding to the first word-line WL(1), and the first control signal at the first access transistor 710(1) may allow the base voltage $V_B$ to be provided at the word-line portion corresponding to the first set 706(1) of memory cells 702, while the second control signal at the third access transistor 710(3) may prevent the base voltage $V_B$ to be provided at the word-line portion corresponding to the third set 710(3) of memory cells 702. A voltage corresponding to ⅔ of the write voltage $V_W$ may be provided at the source nodes of the access transistors 710(2), 710(4) corresponding to the second word-line WL(2), and the first control signal (and gate-source voltage drop) at the second access transistor 710(2) may allow the voltage corresponding to ⅔ of the write voltage $V_W$ to be provided at the word-line portion corresponding to the second set 710(2) of memory cells 702, while the second control signal at the fourth access transistor 710(3) may prevent the voltage corresponding to ⅔ of the write voltage $V_W$ to be provided at the word-line portion corresponding to the fourth set 710(4) of memory cells. The write voltage $V_W$ may be provided at the bit-lines BL(1), BL(2) and source-lines SL(1), SL(2) corresponding to the first set 706(1) of memory cells 702, and the base voltage $V_B$ may be provided at the bit-lines BL(3), BL(4) and source-lines SL(3), SL(4) corresponding to the sets 706(3), 706(4) of memory cells 702 that do not share bit-lines and source-lines with the first set 706(1). The writing in FIG. 7B may provide writing "00 . . . " in the first word of the memory cell arrangement 700.

With the scheme described in FIG. 7B, the memory cells 702w to be written experience a write voltage drop (with amplitude –$V_W$), e.g. having negative polarity. The memory cells 702 not intended to be written of the sets 706(3), 706(4) of memory cells 702 that do not share bit-lines and source-lines with the first set 706(1) do not experience any voltage drop (e.g., 0 V), so that a disturb at those memory cells may be prevented. The memory cells 702 not intended to be written of the set 706(2) of memory cells 702 sharing bit-lines and source-lines with the first set 706(1) may experience a disturb voltage drop (with amplitude ⅓ of the write voltage $V_W$), which may be compensated with a counter-disturb operation, as described above. In this configuration, the access transistors 710(3), 710(4) may prevent the disturb at the memory cells 702 of the sets 706(3), 706(4) that do not share bit-lines and source-lines with the set including the written memory cells 702w, thus reducing the overall detrimental effects for the memory cell arrangement 700.

Figure 8:
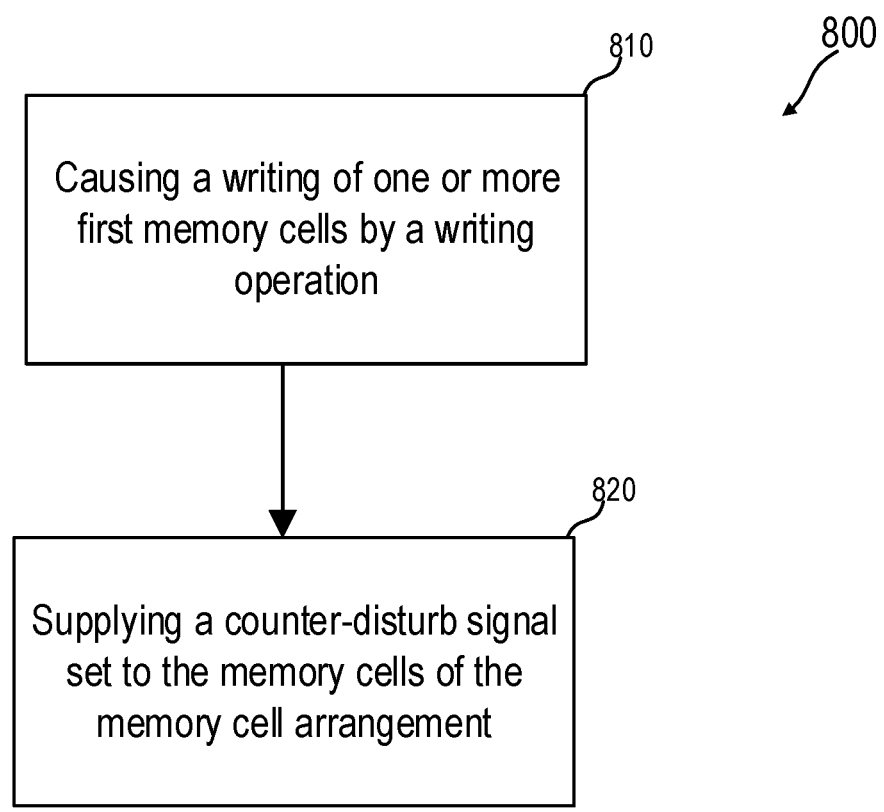
FIG. 8 shows a schematic flow diagram of a method of writing one or more memory cells of a memory cell arrangement according to various aspects.

FIG. 8 shows a schematic flow diagram of a method 800 of operating a memory cell arrangement (e.g., the memory cell arrangement 300, 400, 500, 600, 700 described in relation to FIG. 3 to FIG. 7B). Illustratively, the method 800 may be a method for writing one or more (first) memory cells of the memory cell arrangement and compensating the disturb at one or more other (second) memory cells of the memory cell arrangement.

The method 800 may include, in 810, causing a writing of one or more (first) memory cells by a writing operation (e.g., a writing operation as described in relation to FIG. 4A, FIG. 4C, FIG. 5A, FIG. 5C, FIG. 6A, FIG. 6C, FIG. 7A, FIG. 7B). The writing operation may include supplying a write signal set (e.g., the write signal set 306w) to the memory cells of the memory cell arrangement to provide a write voltage drop at the one or more first memory cells to bring the one or more first memory cells into a memory state of at least two memory states by switching a respective polarization state of each of the one or more first memory cells (e.g., by polarizing the respective spontaneous-polarizable memory layer). The write signal set may cause a disturb voltage drop at one or more other (second) memory cells of the memory cell arrangement that are not intended to be written. The disturb voltage drop may cause a disturb of the one or more second memory cells, as described above.

The method may include, in 820, supplying a counter-disturb signal set (e.g., the counter-disturb signal set 306c) to the memory cells of the memory cell arrangement. The counter-disturb signal set may provide a counter-disturb voltage drop at the one or more second memory cells to at least partially compensate the disturb caused by the write signal set.

In the following, various examples are provided that may include one or more aspects described above with reference to a memory cell (e.g., the capacitive memory structure 100, the memory cell 200), a memory cell arrangement (e.g., the memory cell arrangement 300, 400, 500, 600, 700) and a method (e.g., the method 800). It may be intended that aspects described in relation to the memory arrangement may apply also to the method, and vice versa.

Example 1 is a memory cell arrangement including: a plurality of spontaneous-polarizable memory cells; and a control circuit configured to cause a writing of one or more first memory cells of the plurality of spontaneous-polarizable memory cells by a writing operation, wherein the writing operation includes: supplying a write signal set to the plurality of spontaneous-polarizable memory cells to provide a write voltage drop at each of the one or more first memory cells to bring each of the one or more first memory cells into a memory state of at least two memory states by switching a respective polarization state of each of the one or more first memory cells, the write signal set causing a disturb voltage drop at one or more second memory cells of the plurality of spontaneous-polarizable memory cells that are not intended to be written, wherein the disturb voltage drop causes a disturb of the one or more second memory cells and maintains a respective polarization state of each of the one or more second memory cells; and wherein the control circuit is further configured to supply a counter-disturb signal set to the plurality of spontaneous-polarizable memory cells, wherein the counter-disturb signal set provides a counter-disturb voltage drop at the one or more second memory cells to at least partially compensate the disturb caused by the write signal set.

In Example 2, the memory cell arrangement of example 1 may optionally further include that the memory cell arrangement includes a plurality of word-lines, and that the one or more first memory cells are corresponding to a first word-line of the plurality of word-lines, and the one or more second memory cells are corresponding to a second word-line of the plurality of word-lines.

In Example 3, the memory cell arrangement of example 1 or 2 may optionally further include that the memory cell arrangement includes a plurality of source/bit-line pairs, and that at least one memory cell of the one or more first memory cells and at least one other memory cell of the one or more second memory cells are corresponding to a same source/bit-line pair of the plurality of source/bit-line pairs.

In Example 4, the memory cell arrangement of any one of examples 1 to 3 may optionally further include that the disturb caused by the disturb voltage drop includes a change of a magnitude of a remanent polarization associated with a respective one of the one or more second memory cells. Illustratively, the disturb caused by the disturb voltage drop at the one or more second memory cells may include a decrease or an increase a magnitude of a remanent polarization associated with a respective one of the one or more second memory cells (e.g., a decrease or an increase a magnitude of a remanent polarization of the respective spontaneous-polarizable memory layer).

In Example 5, the memory cell arrangement of any one of examples 1 to 4 may optionally further include that the disturb voltage drop is configured to either partially polarize or partially depolarize each memory cell of the one or more second memory cells. Illustratively, the disturb voltage drop may be configured to either at least partially polarize the respective spontaneous-polarizable memory layer of the one or more second memory cells or at least partially depolarize the respective spontaneous-polarizable memory layer of the one or more second memory cells.

In Example 6, the memory cell arrangement of any one of examples 1 to 5 may optionally further include that the counter-disturb signal set is configured to compensate the disturb caused by the disturb voltage drop by partially polarizing or partially depolarizing a respective one of the one or more second memory cells. Illustratively, the counter-disturb voltage drop may be configured to compensate the disturb caused by the disturb voltage drop by at least partially polarizing the respective spontaneous-polarizable memory layer of the one or more second memory cells or by at least partially depolarizing the respective spontaneous-polarizable memory layer of the one or more second memory cells.

In Example 7, the memory cell arrangement of any one of examples 1 to 6 may optionally further include that the counter-disturb voltage drop is configured to change (e.g., increase or reduce) a magnitude of the respective remanent polarization associated with the one or more second memory cells, e.g. a magnitude of the respective polarization of the spontaneous-polarizable memory layer of the one or more second memory cells, without switching the respective memory state of the one or more second memory cells.

In Example 8, the memory cell arrangement of any one of examples 1 to 7 may optionally further include that the respective counter-disturb voltage drop at a respective second memory cell of the one or more second memory cells has an opposite polarity with respect to a corresponding disturb voltage drop at the respective second memory cell.

In Example 9, the memory cell arrangement of any one of examples 1 to 8 may optionally further include that the respective counter-disturb voltage drop at a respective second memory cell of the one or more second memory cells has an amplitude having a same absolute value and opposite polarity with respect to an amplitude of a corresponding disturb voltage drop at the respective second memory cell.

In Example 10, the memory cell arrangement of any one of examples 1 to 9 may optionally further include that the disturb voltage drop is configured (e.g., has an amplitude such that) not to switch a respective memory state the one or more second memory cells are residing in (illustratively, to maintain a respective memory state the one or more second memory cells are residing in).

In Example 11, the memory cell arrangement of any one of examples 1 to 10 may optionally further include that the counter-disturb voltage drop is configured (e.g., has an amplitude such that) not to switch a respective memory state the one or more second memory cells are residing in (illustratively, to maintain a respective memory state the one or more second memory cells are residing in).

In Example 12, the memory cell arrangement of any one of examples 1 to 11 may optionally further include that an absolute value of an amplitude of the write voltage drop corresponds to an absolute value of an amplitude of a write voltage, and that an absolute value of an amplitude of the disturb voltage drop is in the range from 0 to about half of the write voltage (as another example, from 0 to about one-third of the write voltage).

In Example 13, the memory cell arrangement of example 12 may optionally further include that an absolute value of an amplitude of the counter-disturb voltage drop is in the range from 0 to about half of the write voltage (as another example, from 0 to about one-third of the write voltage).

In Example 14, the memory cell arrangement of any one of examples 1 to 13 may optionally further include that each of the plurality of memory cells is unambiguously assigned to one word line and to one source/bit-line pair.

In Example 15, the memory cell arrangement of any one of examples 1 to 14 may optionally further include that each memory cell of the plurality of spontaneous-polarizable memory cells includes a spontaneous-polarizable memory layer, and that a material of the spontaneous-polarizable memory layer includes at least one of the following: a doped transition metal oxide, an undoped transition metal oxide, a doped transition metal nitride, an undoped transition metal nitride, a doped metal nitride, and/or an undoped metal nitride.

In Example 16, the memory cell arrangement of any one of examples 1 to 15 may optionally further include that each memory cell of the plurality of spontaneous-polarizable memory cells includes: a first electrode, a second electrode, and a spontaneous-polarizable memory layer disposed between the first electrode and the second electrode.

In Example 17, the memory cell arrangement of example 16 may optionally further include that the first electrode, the second electrode, and the spontaneous-polarizable memory layer form a capacitive memory structure.

In Example 18, the memory cell arrangement of any one of examples 1 to 17 may optionally further include that each memory cell of the plurality of spontaneous-polarizable memory cells includes a field-effect transistor structure, the field-effect transistor structure including two source/drain regions, and a gate structure.

In Example 19, the memory cell arrangement of example 17 and 18 may optionally further include that the gate structure is coupled to the capacitive memory structure, or that the capacitive memory structure is integrated in the field-effect transistor structure.

In Example 20, the memory cell arrangement of example 18 or 19 may optionally further include that one of the two source/drain regions of the field-effect transistor structure is connected to a bit line of a corresponding source/bit line pair, the other one of the two source/drain regions of the field-effect transistor structure is connected to a source line of the corresponding source/bit line pair, and that at least one of the capacitive structure or the gate structure of the field-effect transistor structure is connected to a corresponding word line.

In Example 21, the memory cell arrangement of any one of examples 1 to 20 may optionally further include that the at least two memory states include a first memory state and a second memory state, and that each memory cell of the plurality of spontaneous-polarizable memory cells has a first threshold voltage in the first memory state and a second threshold voltage in the second memory state.

In Example 22, the memory cell arrangement of any one of examples 2 to 21 may optionally further include that the write signal set includes a first voltage supplied to the first word line corresponding to the one or more first memory cells, and a second voltage supplied to the second word line corresponding to the one or more second memory cells.

In Example 23, the memory cell arrangement of example 22 may optionally further include that an absolute value of a difference between the first voltage and the second voltage is two-thirds of the write voltage.

In Example 24, the memory cell arrangement of example 22 or 23 may optionally further include that the write signal set further includes a third voltage supplied to the one or more source/bit-line pairs corresponding to the one or more first memory cells, and that an absolute value of a difference between the first voltage and the third voltage corresponds to the write voltage.

In Example 25, the memory cell arrangement of example 24 may optionally further include that the control circuit defines a base voltage, and that at least one of the first voltage or the third voltage includes the base voltage.

In Example 26, the memory cell arrangement of example 24 or 25 may optionally further include that an absolute value of a difference between the second voltage and the third voltage is in the range from 0 to one-third of the write voltage.

In Example 27, the memory cell arrangement of any one of examples 22 to 26 may optionally further include that the write signal set further includes a fourth voltage supplied to the one or more source/bit-line pairs corresponding to one or more of the second memory cells that do not share the respective source/bit-line pair with one of the one or more first memory cells.

In Example 28, the memory cell arrangement of example 27 may optionally further include that an absolute value of a difference between the second voltage and the fourth voltage is in the range from 0 to one-third of the write voltage.

In Example 29, the memory cell arrangement of any one of examples 2 to 28 may optionally further include that the counter-disturb signal set includes a first counter-disturb voltage supplied to the first word-line corresponding to the one or more first memory cells and a second counter-disturb voltage to the second word-line corresponding to the one or more second memory cells.

In Example 30, the memory cell arrangement of example 29 may optionally further include that the first counter-disturb voltage has a same voltage value as the second counter-disturb voltage.

In Example 31, the memory cell arrangement of example 29 or 30 may optionally further include that the counter-disturb signal set further includes a third counter-disturb voltage supplied to the one or more source/bit-line pairs corresponding to the one or more first memory cells, and that an absolute value of a difference between the first counter-disturb voltage and the third counter-disturb voltage is in the range from 0 to one-third of the write voltage.

In Example 32, the memory cell arrangement of example 31 may optionally further include that the counter-disturb signal set further includes a fourth counter-disturb voltage supplied to the one or more source/bit-line pairs corresponding to one or more of the second memory cells that do not share the respective source/bit-line pair with one of the one or more first memory cells.

In Example 33, the memory cell arrangement of example 31 or 32 may optionally further include that an absolute value of a difference between the first counter-disturb voltage and the third counter-disturb voltage is in the range from 0 to one-third of the write voltage.

In Example 34, the memory cell arrangement of any one of examples 2 to 33 may optionally further include that the first word-line has a corresponding first access transistor configured to allow or prevent a current flow in the first word-line, and that the second word-line has a corresponding second access transistor configured to allow or prevent a current flow in the second word-line.

The first access transistor may be configured to allow or prevent a voltage on the first word-line (e.g., allow or prevent a voltage to be applied at the memory cells corresponding to the first word-line), and the second access transistor may be configured to allow or prevent a voltage on the second word-line (e.g., allow or prevent a voltage to be applied at the memory cells corresponding to the second word-line).

Example 35 is a memory cell arrangement including: a first set of spontaneous-polarizable memory cells and a second set of spontaneous-polarizable memory cells, wherein the memory cells of the first set of memory cells are corresponding to a first word-line, and wherein the memory cells of the second set of memory cells are corresponding to a second word-line; and a control circuit configured to: cause a writing of one or more memory cells of the first set of memory cells by a writing operation, wherein the writing operation includes supplying a write signal set to the first set of memory cells and to the second set of memory cells, wherein the write signal set provides a write voltage drop at each of the one or more memory cells of the first set of memory cells intended to be written to bring the one or more memory cells into a memory state of at least two memory states by switching a respective polarization state of each of the one or more memory cells, wherein the write signal set causes a disturb at the memory cells of the second set of memory cells that are not intended to be written; and wherein the control circuit is further configured to supply a counter-disturb signal set to the first set of memory cells and to the second set of memory cells, wherein the counter-disturb signal set provides a counter-disturb voltage drop at each memory cell of the second set of memory cells to at least partially compensate the disturb caused by the write signal set.

In Example 36, the memory cell arrangement of example 35 may optionally further include one, or some, or all the features of any one of examples 1 to 34, where appropriate.

Example 37 is a memory cell arrangement including: a plurality of memory cells, each memory cell including a respective spontaneous-polarizable memory layer, and a control circuit configured to: cause a writing of one or more first memory cells of the plurality of memory cells, wherein writing the one or more first memory cells causes a disturb of one or more second memory cells of the plurality of memory cells that are not being written, and compensate the disturb caused by the writing of the one or more first memory cells by polarizing or at least partially depolarizing the spontaneous-polarizable memory layer of the one or more second memory cells.

In Example 38, the memory cell arrangement of example 37 may optionally further include one, or some, or all the features of any one of examples 1 to 34, where appropriate.

Example 39 is a memory cell arrangement including: a first spontaneous-polarizable memory cell and a second spontaneous-polarizable memory cell, and a control circuit configured to: cause a writing of the first memory cell, wherein the writing the first memory cell causes a disturb at the second memory cell, and at least partially compensate the disturb caused by the writing of the first memory cell by at least partially polarizing or at least partially depolarizing the second memory cell.

In Example 40, the memory cell arrangement of example 39 may optionally further include one, or some, or all the features of any one of examples 1 to 34, where appropriate.

Example 41 is a method of operating a memory cell arrangement, the memory cell arrangement including a plurality of memory cells, each memory cell including a spontaneous-polarizable memory layer, the method including: causing a writing of one or more first memory cells of the plurality of memory cells by a writing operation, wherein the writing operation includes supplying a write signal set to the plurality of memory cells, wherein the write signal set provides a write voltage drop at the one or more first memory cells to bring the one or more first memory cells into a memory state of at least two memory states by polarizing the respective spontaneous-polarizable memory layer, wherein the write signal set causes a disturb voltage drop at one or more second memory cells of the plurality of memory cells that are not being written, the disturb voltage drop causing a disturb of the one or more second memory cells; and supplying a counter-disturb signal set to the plurality of memory cells, wherein the counter-disturb signal set provides a counter-disturb voltage drop at the one or more second memory cells to compensate the disturb caused by the write signal set.

Example 42 is a method of operating a memory cell arrangement, the memory cell arrangement including a plurality of spontaneous-polarizable memory cells, the method including: partially polarizing or partially depolarizing one or more second memory cells of the plurality of spontaneous-polarizable memory cells to compensate a respective partial depolarization or partial polarization caused by a writing operation on one or more first memory cells of the plurality of spontaneous-polarizable memory cells.

In Example 43, the method of example 42 may optionally further include that the writing operation includes supplying a write signal set to the plurality of spontaneous-polarizable memory cells to provide a write voltage drop at each of the one or more first memory cells to bring each of the one or more first memory cells into a memory state of at least two memory states by switching a respective polarization state of each of the one or more first memory cells, the write signal set causing a disturb voltage drop at one or more second memory cells of the plurality of spontaneous-polarizable memory cells that are not intended to be written, wherein the disturb voltage drop causes a disturb of the one or more second memory cells and maintains a respective polarization state of each of the one or more second memory cells and that partially polarizing or partially depolarizing the one or more second memory cells includes supplying a counter-disturb signal set to the plurality of spontaneous-polarizable memory cells, wherein the counter-disturb signal set provides a counter-disturb voltage drop at the one or more second memory cells to at least partially compensate the disturb caused by the write signal set.

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

The term region used with regards to a "source region", "drain region", "channel region", and the like, may be used herein to mean a continuous region of a semiconductor portion (e.g., of a semiconductor wafer or a part of a semiconductor wafer, a semiconductor layer, a fin, a semiconductor nanosheet, a semiconductor nanowire, etc.). In some aspects, the continuous region of a semiconductor portion may be provided by semiconductor material having only one dominant doping type.

The term "metal material" may be used herein to describe a metal (e.g., a pure or substantially pure metal), a mixture of more than one metal, a metal alloy, an intermetallic material, a conductive metal compound (e.g., a nitride), and the like. Illustratively, the term "metal material" may be used herein to describe a material having an electrical conductivity typical of a metal, for example an electrical conductivity greater than $10^6$ S/m at a temperature of 20° C. The term "metal material" may be used herein to describe a material having the Fermi level inside at least one band.

In various aspects, reference may be made to the position of a memory cell within a memory cell arrangement. The notation may be based on a matrix disposition of the memory cells in the memory cell arrangement. Illustratively, the memory cell in position (1,1) may be the memory cell in the top left corner (as represented in the figures) of the memory cell arrangement, the memory cell in position (1,2) may be the memory cell immediately to the right of the memory cell in position (1,1), etc. The memory cell in position (1,1) may be the memory cell in the first row and first column of the memory cell arrangement, the memory cell in position (1,2) may be the memory cell in the first row and second column of the memory cell arrangement, etc.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory cell arrangement comprising:
a plurality of spontaneous-polarizable memory cells; and
a control circuit configured to cause a writing of one or more first memory cells of the plurality of spontaneous-polarizable memory cells by a writing operation, wherein the writing operation comprises:
supplying a write signal set to the plurality of spontaneous-polarizable memory cells to provide a write voltage drop at each of the one or more first memory cells to bring each of the one or more first memory cells into a memory state of at least two memory states by switching a respective polarization state of each of the one or more first memory cells, the write signal set causing a disturb voltage drop at one or more second memory cells of the plurality of spontaneous-polarizable memory cells that are not intended to be written, wherein the disturb voltage drop causes a disturb of the one or more second memory cells and maintains a respective polarization state of each of the one or more second memory cells; and
wherein the control circuit is further configured to supply a counter-disturb signal set to the plurality of spontaneous-polarizable memory cells, wherein the counter-disturb signal set provides a counter-disturb voltage drop at the one or more second memory cells to at least partially compensate the disturb caused by the disturb voltage drop.

2. The memory cell arrangement according to claim 1, wherein the memory cell arrangement comprises a plurality of word-lines, and
wherein the one or more first memory cells are corresponding to a first word-line of the plurality of word-lines, and the one or more second memory cells are corresponding to a second word-line of the plurality of word-lines.

3. The memory cell arrangement according to claim 1, wherein the memory cell arrangement comprises a plurality of source/bit-line pairs, and
wherein at least one memory cell of the one or more first memory cells and at least one memory cell of the one or more second memory cells are corresponding to a same source/bit-line pair of the plurality of source/bit-line pairs.

4. The memory cell arrangement according to claim 1, wherein the disturb caused by the disturb voltage drop comprises a change of a magnitude of a remanent polarization associated with a respective one of the one or more second memory cells.

5. The memory cell arrangement according to claim 4, wherein the disturb voltage drop is configured to either partially polarize or partially depolarize each memory cell of the one or more second memory cells.

6. The memory cell arrangement according to claim 4, wherein the counter-disturb signal set is configured to compensate the disturb caused by the disturb voltage drop by partially polarizing or partially depolarizing a respective one of the one or more second memory cells.

7. The memory cell arrangement according to claim 6, wherein each memory cell of the plurality of spontaneous-polarizable memory cells comprises a spontaneous-polarizable memory layer, and
wherein the counter-disturb voltage drop is configured to change a magnitude of the remanent polarization of the respective spontaneous-polarizable memory-layer of the one or more second memory cells without switching the respective memory state of the one or more second memory cells.

8. The memory cell arrangement according to claim 1, wherein the respective counter-disturb voltage drop at a respective second memory cell of the one or more second memory cells has an opposite polarity with respect to a corresponding disturb voltage drop at the respective second memory cell.

9. The memory cell arrangement according to claim 1, wherein the respective counter-disturb voltage drop at a respective second memory cell of the one or more second memory cells has an amplitude having a same absolute value and opposite polarity with respect to an amplitude of a corresponding disturb voltage drop at the respective second memory cell.

10. The memory cell arrangement according to claim 1,
wherein an absolute value of an amplitude of the write voltage drop corresponds to an absolute value of an amplitude of a write voltage, and
wherein an absolute value of an amplitude of the disturb voltage drop is in the range from zero to about half of the write voltage.

11. The memory cell arrangement according to claim 1,
wherein each memory cell of the plurality of spontaneous-polarizable memory cells comprises a spontaneous-polarizable memory layer, and
wherein a material of the spontaneous-polarizable memory layer comprises at least one of the following:
a doped transition metal oxide,
an undoped transition metal oxide,
a doped transition metal nitride,
an undoped transition metal nitride,
a doped metal nitride, and/or
an undoped metal nitride.

12. The memory cell arrangement according to claim 1,
wherein each memory cell of the plurality of spontaneous-polarizable memory cells comprises a first electrode, a second electrode, and a spontaneous-polarizable memory layer disposed between the first electrode and the second electrode.

13. The memory cell arrangement according to claim 12,
wherein the first electrode, the second electrode, and the spontaneous-polarizable memory layer form a capacitive memory structure.

14. The memory cell arrangement according to claim 13,
wherein each memory cell of the plurality of spontaneous-polarizable memory cells comprises a field-effect transistor structure, the field-effect transistor structure comprising two source/drain regions, and a gate structure, and
wherein the gate structure is coupled to the capacitive memory structure, or wherein the capacitive memory structure is integrated in the field-effect transistor structure.

15. The memory cell arrangement according to claim 1,
wherein the at least two memory states comprise a first memory state and a second memory state, and
wherein each memory cell of the plurality of spontaneous-polarizable memory cells has a first threshold voltage in the first memory state and a second threshold voltage in the second memory state.

16. The memory cell arrangement according to claim 2,
wherein the first word-line has a corresponding first access transistor configured to allow or prevent a current flow in the first word-line, and
wherein the second word-line has a corresponding second access transistor configured to allow or prevent a current flow in the second word line.

17. The memory cell arrangement according to claim 16,
wherein the corresponding first access transistor is corresponding to a first set of memory cells of the plurality of spontaneous-polarizable memory cells, and
wherein the corresponding second access transistor is corresponding to a second set of memory cells of the plurality of spontaneous-polarizable memory cells.

18. A memory cell arrangement comprising:
a first spontaneous-polarizable memory cell and a second spontaneous-polarizable memory cell, and
a control circuit configured to:
cause a writing of the first spontaneous-polarizable memory cell, wherein the writing the first spontaneous-polarizable memory causes a disturb at the second spontaneous-polarizable memory cell, and
at least partially compensate the disturb caused by the writing of the first spontaneous-polarizable memory cell by at least partially polarizing or at least partially depolarizing the second spontaneous-polarizable memory cell.

19. A method of operating a memory cell arrangement, the memory cell arrangement comprising a plurality of spontaneous-polarizable memory cells, the method comprising:
partially polarizing or partially depolarizing one or more second memory cells of the plurality of spontaneous-polarizable memory cells to compensate a respective partial depolarization or partial polarization caused by a writing operation on one or more first memory cells of the plurality of spontaneous-polarizable memory cells; and wherein the writing operation comprises supplying a write signal set to the plurality of spontaneous-polarizable memory cells to provide a write voltage drop at each of the one or more first memory cells to bring each of the one or more first memory cells into a memory state of at least two memory states by switching a respective polarization state of each of the one or more first memory cells, the write signal set causing a disturb voltage drop at one or more second memory cells of the plurality of spontaneous-polarizable memory cells that are not intended to be written, wherein the disturb voltage drop causes a disturb of the one or more second memory cells and maintains a respective polarization state of each of the one or more second memory cells.

20. The method according to claim 19, wherein partially polarizing or partially depolarizing the one or more second memory cells comprises supplying a counter-disturb signal set to the plurality of spontaneous-polarizable memory cells, wherein the counter-disturb signal set provides a counter-disturb voltage drop at the one or more second memory cells to at least partially compensate the disturb caused by the disturb voltage drop.

* * * * *

UNITED STATES PATENT AND TRADEMARK OFFICE
CERTIFICATE OF CORRECTION

PATENT NO. : 11,393,518 B1
APPLICATION NO. : 17/341884
DATED : July 19, 2022
INVENTOR(S) : Johannes Ocker It is certified that error appears in the above-identified patent and that said Letters Patent is hereby corrected as shown below:

In the Claims

Claim 18, Column 44, Line 14 insert --cell--

Signed and Sealed this
Thirtieth Day of August, 2022

Katherine Kelly Vidal
*Director of the United States Patent and Trademark Office*